(12) United States Patent
Babaee et al.

(10) Patent No.: US 11,817,873 B1
(45) Date of Patent: Nov. 14, 2023

(54) DIGITAL-TO-ANALOG CONVERTER (DAC) ARCHITECTURE OPTIMIZATION

(71) Applicants: Ramin Babaee, Ottawa (CA); Shahab Oveis Gharan, Ottawa (CA); Martin Bouchard, Cantley (CA)

(72) Inventors: Ramin Babaee, Ottawa (CA); Shahab Oveis Gharan, Ottawa (CA); Martin Bouchard, Cantley (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/741,139

(22) Filed: May 10, 2022

(51) Int. Cl.
  *H03M 1/10* (2006.01)
  *H03M 1/06* (2006.01)
(52) U.S. Cl.
  CPC ................ *H03M 1/0617* (2013.01)
(58) Field of Classification Search
  CPC .................... H03M 1/0617; H03M 1/66
  USPC ..................... 341/144, 120, 118
  See application file for complete search history.

(56) References Cited

U.S. PATENT DOCUMENTS

| | | | |
|---|---|---|---|
| 5,617,058 A | 4/1997 | Adrian et al. | |
| 5,841,325 A * | 11/1998 | Knotts | H03K 3/0231 331/177 R |
| 6,046,873 A | 4/2000 | Hori et al. | |
| 6,198,416 B1 | 3/2001 | Velazquez | |
| 6,424,275 B1 | 7/2002 | Velazquez | |
| 6,434,110 B1 | 8/2002 | Hemkumar | |
| 6,570,514 B1 | 5/2003 | Velazquez | |
| 7,173,552 B1 * | 2/2007 | Garcia | H03M 1/0678 341/120 |
| 7,990,297 B1 | 8/2011 | Korodi et al. | |
| 10,236,006 B1 | 3/2019 | Gurijala et al. | |
| 10,374,623 B1 | 8/2019 | Oveis Gharan et al. | |
| 11,190,277 B1 | 11/2021 | Nguyen et al. | |
| 11,233,523 B1 | 1/2022 | Oveis Gharan et al. | |
| 2008/0158026 A1 | 7/2008 | O'Brien | |
| 2008/0215650 A1 | 9/2008 | Tsatsanis et al. | |
| 2021/0125314 A1 | 4/2021 | Jones et al. | |
| 2021/0194607 A1 | 6/2021 | Shiner et al. | |
| 2022/0236140 A1 | 7/2022 | Hui et al. | |

OTHER PUBLICATIONS

Andersson et al., "Modeling of Glitches due to Rise/Fall Asymmetry in Current-Steering Digital-to-Analog Converters," IEEE Transactions on Circuits and Systems-I: Regular Papers, vol. 52, No. 11, Nov. 2005.

(Continued)

*Primary Examiner* — Peguy Jean Pierre
(74) *Attorney, Agent, or Firm* — INTEGRAL INTELLECTUAL PROPERTY INC.; Amy Scouten; Miriam Paton

(57) ABSTRACT

A digital-to-analog converter (DAC) comprises circuitry configured to generate, based on a mapping, L signals representing an N-bit digital input, wherein N and L are positive integers, and wherein $N<L<2^N-1$, and circuitry configured to control current flow from L weighted current sources using the L respective signals, thereby generating an analog output that uniquely represents the N-bit digital input, wherein the weighted current sources have weights configured to minimize at least one error metric associated with the analog output.

20 Claims, 18 Drawing Sheets

(56) References Cited

OTHER PUBLICATIONS

Baird et al., "Linearity Enhancement of Multibit Delta Sigma A/D and D/A Converters Using Data Weighted Averaging," IEEE Transactions on Circuits and Systems-II: Analog and Digital Signal Processing, vol. 42, No. 12, Dec. 1995.
Bastos et al., "A 12-Bit Intrinsic Accuracy High-Speed CMOS DAC," IEEE Journal of Solid-State Circuits, vol. 33, No. 12, Dec. 1998.
Bugeja et al., "A 14-b, 100-MS/s CMOS DAC Designed for Spectral Performance," IEEE Journal of Solid-State Circuits, vol. 34, No. 12, Dec. 1999.
Chan et al., "A 14b 100MS/s DAC with Fully Segmented Dynamic Element Matching," IEEE International Solid-State Circuits Conference, Feb. 2006.
Chen et al., "A 14-bit 200-MHz Current-Steering DAC with Switching-Sequence Post-Adjustment Calibration," IEEE Journal of Solid-State Circuits, vol. 42, No. 11, Nov. 2007.
Cong et al., "Switching Sequence Optimization for Gradient Error Compensation in Thermometer-Decoded DAC Arrays," IEEE Transactions on Circuits and Systems-II: Analog and Digital Signal Processing, vol. 47, No. 7, Jul. 2000.
Conroy et al., "Statistical Design Techniques for D/A Converters," IEEE Journal of Solid-State Circuits, vol. 24, No. 4, Aug. 1989.
Das et al., "Differential Evolution: A Survey of the State-of-the-Art," IEEE Transactions on Evolutionary Computation, vol. 15, No. 1, Feb. 2011.
Eielsen et al., "Large-Amplitude Dithering Mitigates Glitches in Digital-to-Analogue Converters," IEEE Transactions on Signal Processing, vol. 68, 2020.
Galton et al., "A Rigorous Error Analysis of D/A Conversion with Dynamic Element Matching," IEEE Transactions on Circuits and Systems-II: Analog and Digital Signal Processing, vol. 42, No. 12, Dec. 1995.
Galton, "Why Dynamic-Element-Matching DACs Work," IEEE Transactions on Circuits and Systems-II: Express Briefs, vol. 57, No. 2, Feb. 2010.
McDonnell et al., "Compensation and Calibration Techniques for Current-Steering DACs," IEEE Circuits and Systems Magazine, May 2017.
Mercer, "A 16-b D/A Converter with Increased Spurious Free Dynamic Range," IEEE Journal of Solid-State Circuits, vol. 29, No. 10, Oct. 1994.
Nakamura et al., "A 10-b 70-MS/s CMOS D/A Converter," IEEE Journal of Solid-State Circuits, vol. 26, No. 4, Apr. 1991.
Rafeeque et al., "A New Technique for On-Chip Error Estimation and Reconfiguration of Current-Steering Digital-to-Analog Converters," IEEE Transactions on Circuits and Systems-I: Regular Papers, vol. 52, No. 11, Nov. 2005.
Rudberg et al., "Glitch Minimization and Dynamic Element Matching in D/A Converters," IEEE International Conference on Electronics, Circuits and Systems, Dec. 2000.
Shen et al., "Random Swapping Dynamic Element Matching Technique for Glitch Energy Minimization in Current-Steering DAC," IEEE Transactions on Circuits and Systems-II: Express Briefs, vol. 57, No. 5, May 2010.
Storn et al., "Differential Evolution—A Simple and Efficient Heuristic for Global Optimization over Continuous Spaces," Journal of Global Optimization, Jan. 1997.
Tang et al., "A 14 bit 200 MS/s DAC With SFDR 78 dBc, IM3—83 dBc and NSD—163 dBm/Hz Across the Whole Nyquist Band Enabled by Dynamic-Mismatch Mapping," IEEE Journal of Solid-State Circuits, vol. 46, No. 6, Jun. 2011.
Tang et al., "DDL-based Calibration Techniques for Timing Errors in Current-Steering DACs," IEEE International Symposium on Circuits and Systems 2006.
Tesch et al., "A Low Glitch 14-b 100-MHz D/A Converter," IEE Journal of Solid-State Circuits, vol. 32, No. 9, Sep. 1997.
Van der Plas et al., "A 14-bit Intrinsic Accuracy Q2 Random Walk CMOS DAC," IEEE Journal of Solid-State Circuits, vol. 34, No. 12, Dec. 1999.
Vesterbacka et al., "Dynamic Element Matching in D/A Converters with Restricted Scrambling," IEEE International Conference on Electronics, Circuits and Systems, Dec. 2000.
Vesterbacka, "Linear-Coded D/A Converters with Small Relative Error Due to Glitches," IEEE Midwest Symposium on Circuits and Systems, Feb. 2001.
Vorenkamp et al., "Fully Bipolar, 120-Msample/s 10-b Track-and-Hold Circuit," IEEE Journal of Solid-State Circuits, vol. 27, No. 7, Jul. 1992.
First Office Action for U.S. Appl. No. 17/742,152 dated Jul. 6, 2023.
International Search Report and Written Opinion for PCT/IB2023/054467 dated Sep. 13, 2023.
Notice of Allowance for U.S. Appl. No. 17/741,152 dated Aug. 28, 2023.
Radulov. "Flexible and self-calibrating current-steering Digital-to-Analog Converters: analysis, classification and design", ISBN: 978-90-38-62125-8, Jan. 14, 2010.

* cited by examiner

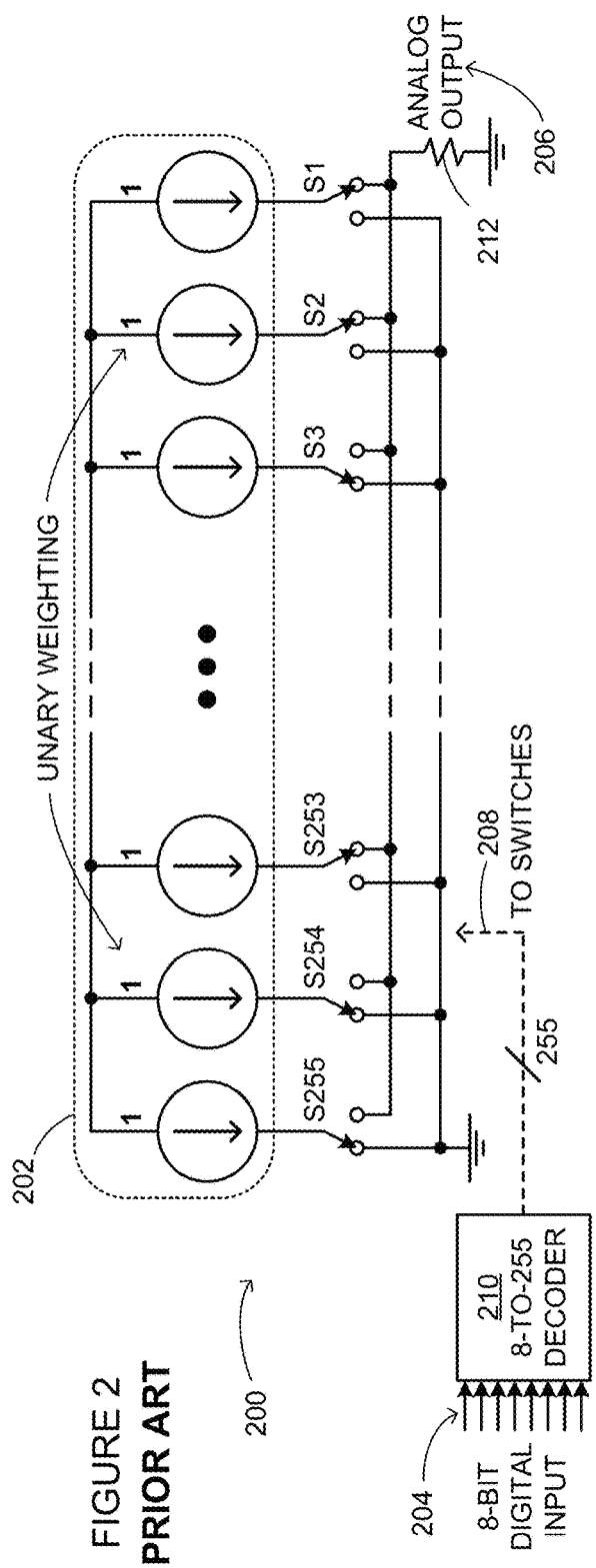
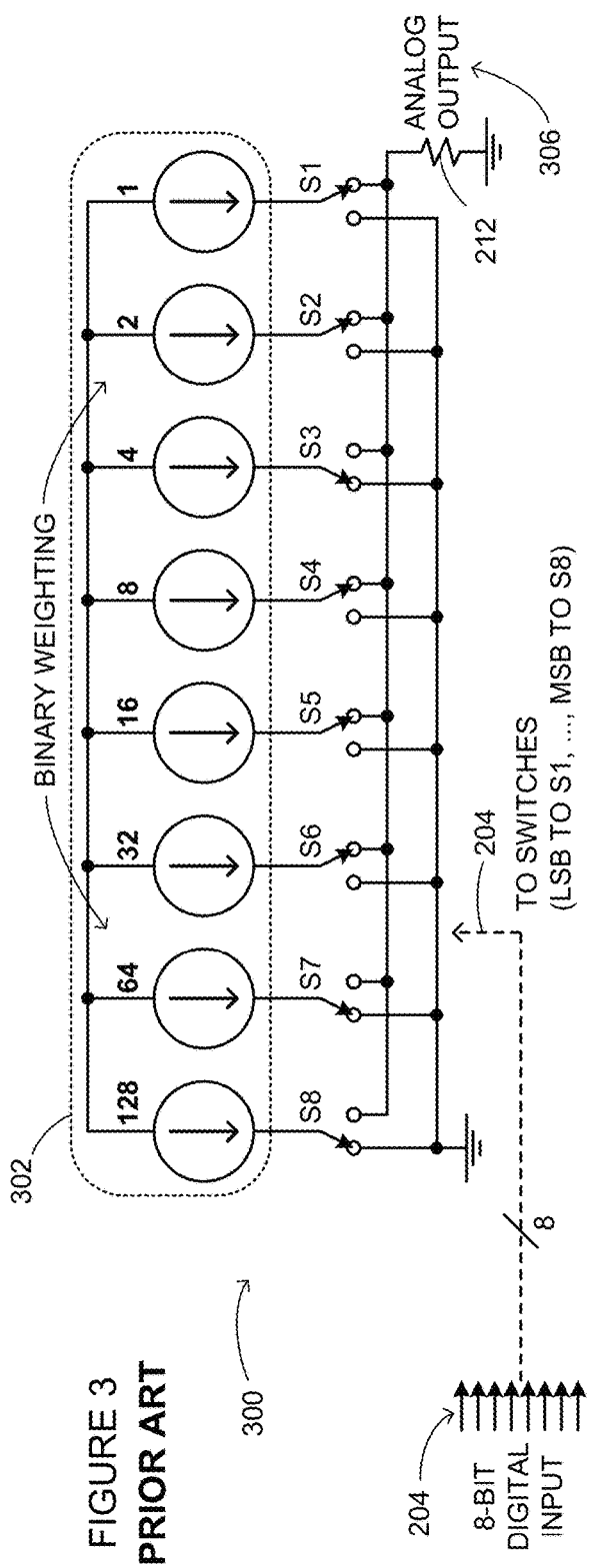

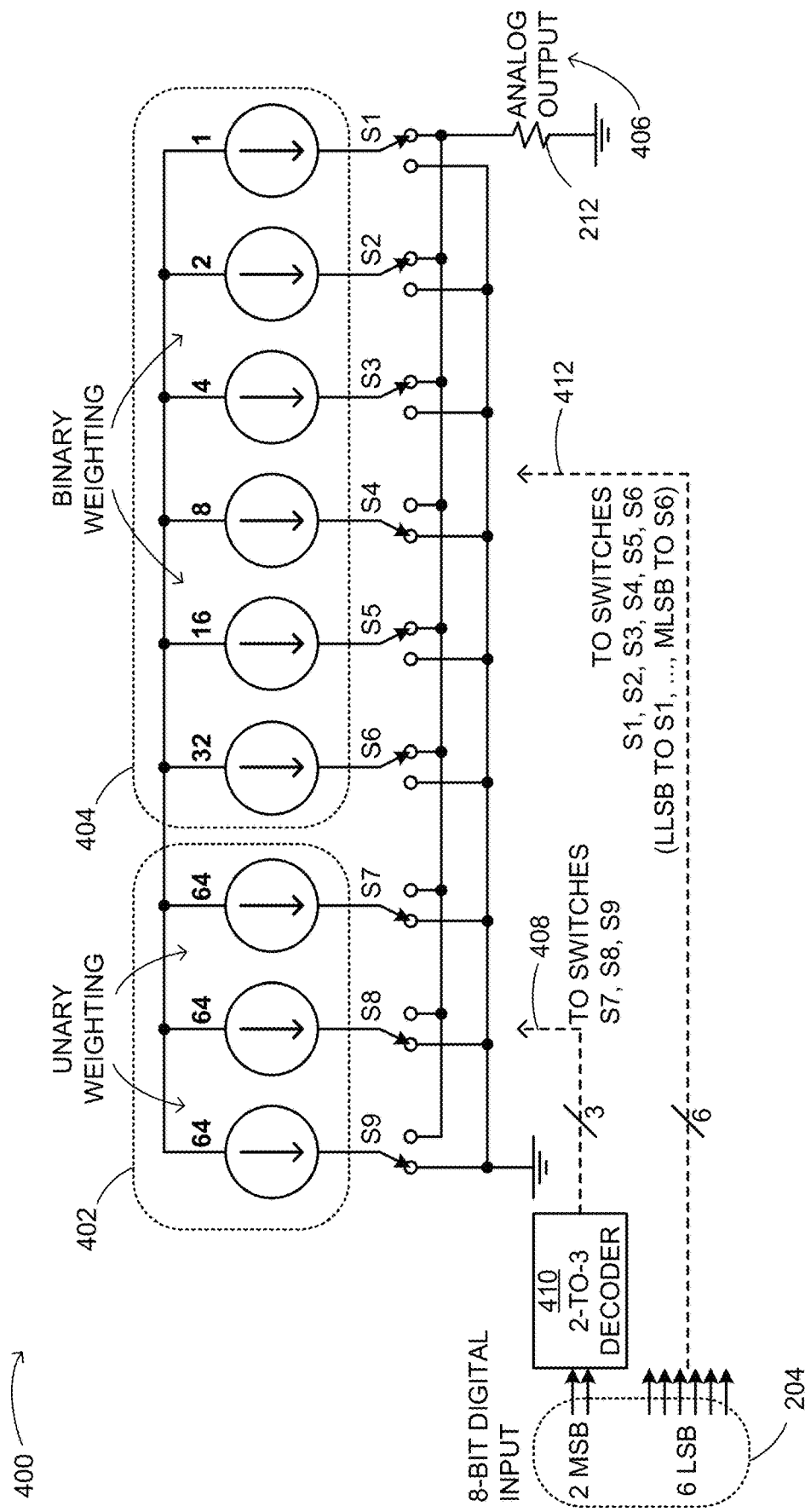

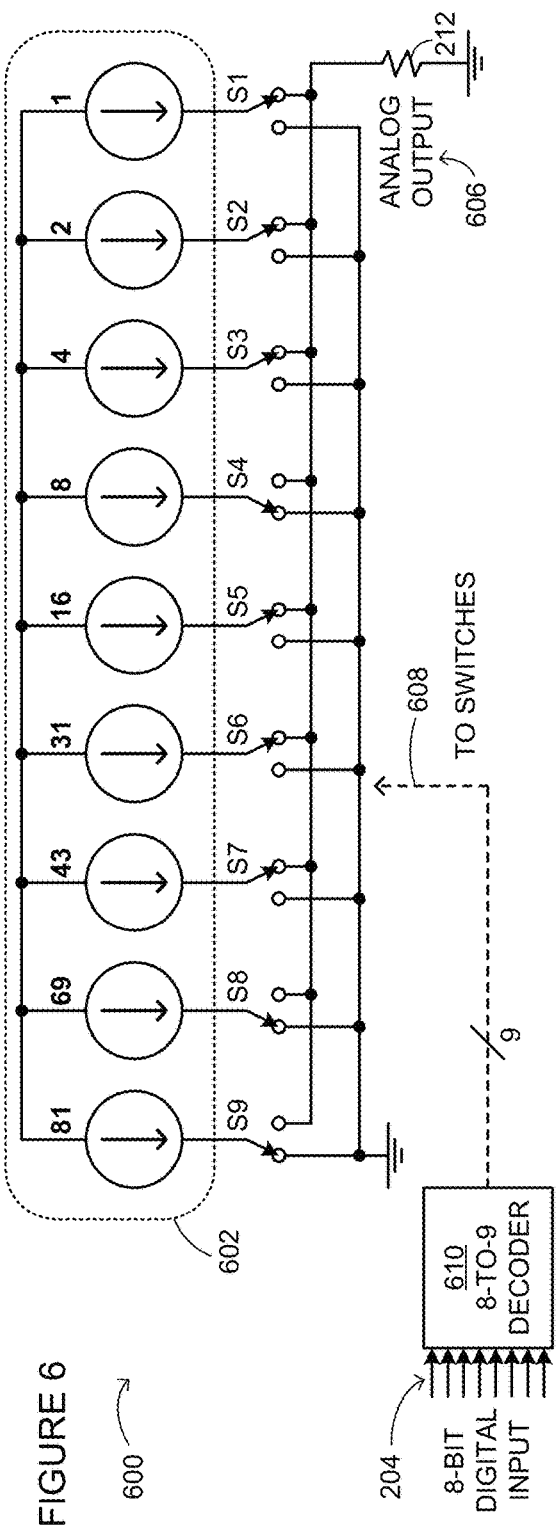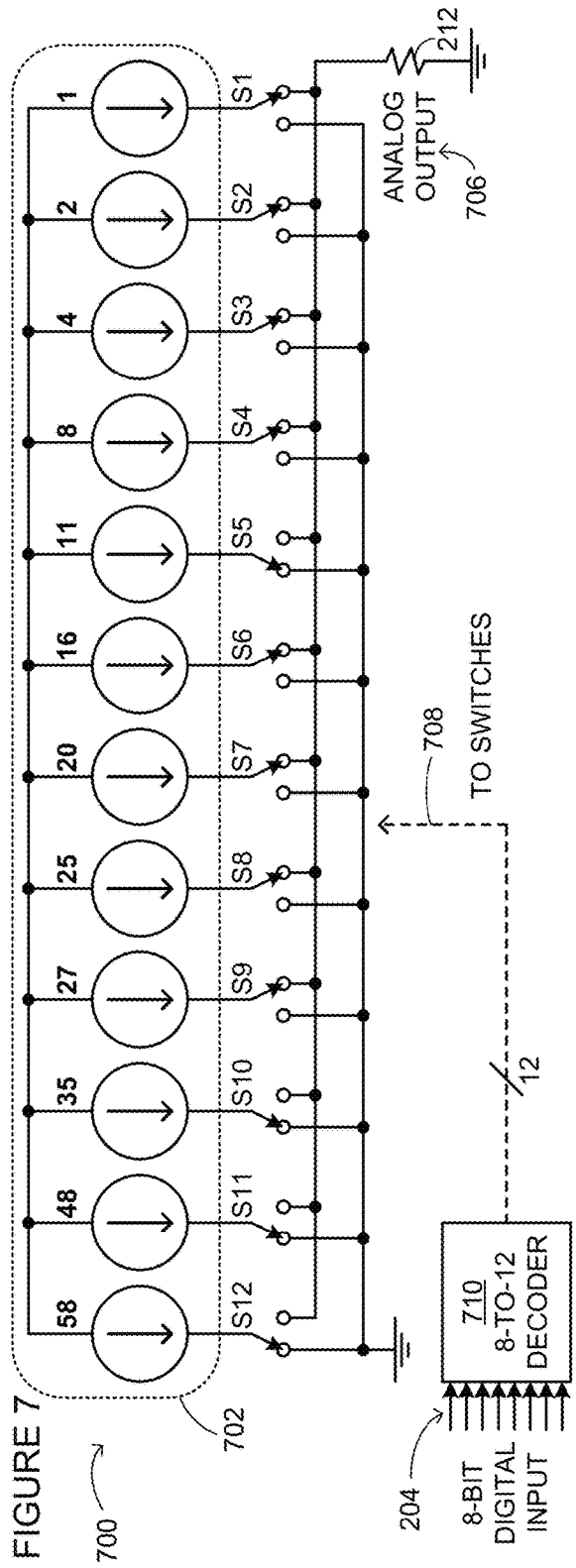

DIGITAL-TO-ANALOG CONVERTER (DAC) ARCHITECTURE OPTIMIZATION

TECHNICAL FIELD

This disclosure is related to the technical field of generating analog signals and digital-to-analog conversion.

BACKGROUND

A digital-to-analog converter (DAC) is configured to convert a digital input into an analog output using a plurality of switchable current sources (i.e., current sources controlled by respective switches). Performance of a DAC may be impacted by mismatches between circuit elements of the DAC.

SUMMARY

According to a broad aspect, a digital-to-analog converter (DAC) comprises circuitry configured to generate, based on a mapping, L signals representing an N-bit digital input, wherein N and L are positive integers, and wherein $N<L<2^N-1$; and circuitry configured to control current flow from L weighted current sources using the L respective signals, thereby generating an analog output that uniquely represents the N-bit digital input, wherein a weight ratio of at least one pair of the weighted current sources is a positive real number different from an integer power of two.

According to some examples, the weighted current sources have weights configured to minimize at least one error metric associated with the analog output.

According to some examples, the at least one error metric represents errors caused by statistical rise/fall asymmetry between currents flowing from the weighted current sources.

According to some examples, the at least one error metric represents errors caused by statistical amplitude mismatches between currents flowing from the weighted current sources.

According to some examples, the at least one error metric represents errors caused by statistical timing offsets of OFF-to-ON and ON-to-OFF transitions between currents flowing from the weighted current sources.

According to some examples, the mapping is configured to minimize the at least one error metric.

According to some examples, the mapping is configured to minimize a DAC-specific error metric representing errors caused by circuit component mismatches measured in the DAC.

According to some examples, the circuit component mismatches comprise one or more of rise/fall asymmetry between currents flowing from the weighted current sources; amplitude mismatches between currents flowing from the weighted current sources; and timing offsets of OFF-to-ON and ON-to-OFF transitions between currents flowing from the weighted current sources.

According to some examples, weights of the weighted current sources do not solely consist of a combination of unary weights and binary weights.

According to some examples, the digital input comprises a pre-compensated digital signal generated based on a distortion model representing circuit component mismatches in the DAC.

BRIEF DESCRIPTION OF THE DRAWINGS

FIG. 2 illustrates a digital-to-analog converter (DAC) architecture comprising unary-weighted current sources in accordance with PRIOR ART;

FIG. 3 illustrates a DAC architecture comprising binary-weighted current sources in accordance with PRIOR ART;

FIG. 4 illustrates a segmented DAC architecture in accordance with PRIOR ART;

FIG. 6 illustrates a first optimized DAC architecture in accordance with some examples of the proposed technology;

FIG. 7 illustrates a second optimized DAC architecture in accordance with some examples of the proposed technology;

DETAILED DESCRIPTION

Figure 1:
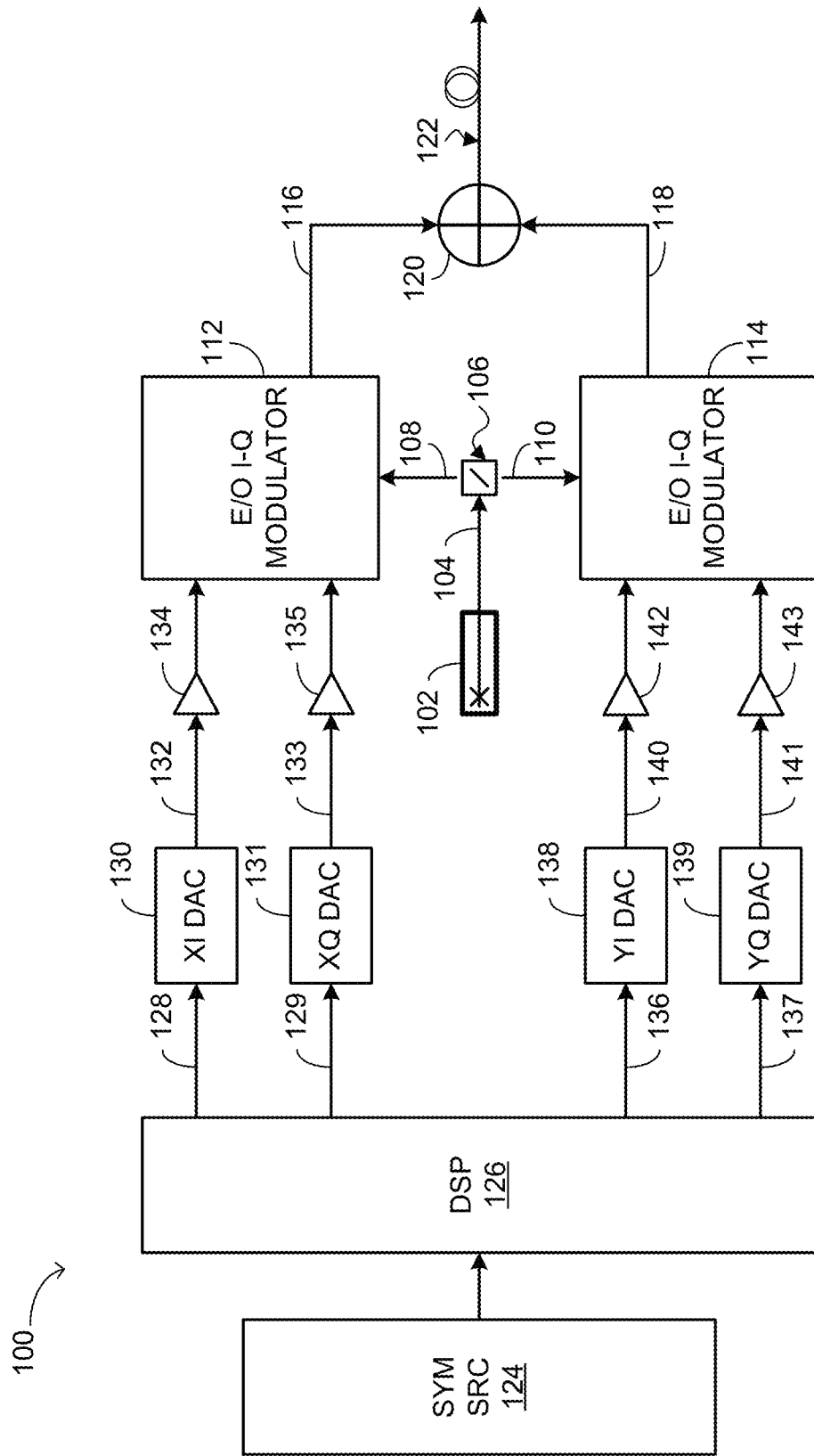
FIG. 1 is a block diagram illustration of an example transmitter.

FIG. 1 is a block diagram illustration of an example transmitter 100. The transmitter 100 is an optical transmitter that employs polarization-division multiplexing (PDM). A laser 102 is operative to generate a continuous wave (CW) optical carrier 104. A polarizing beam splitter 106 is operative to split the CW optical carrier 104 into orthogonally-polarized components 108, 110 (nominally referred to as the "X-polarization" component and the "Y-polarization" component) that are modulated by respective electrical-to-optical modulators 112, 114 to produce modulated polarized optical signals 116, 118 that are combined by a beam combiner 120, thus yielding an optical signal 122.

A symbol source 124 is operative to generate a stream of symbols representing data to be transmitted in the optical signal 122. A digital signal processor (DSP) 126 is operative to process the symbols output from the symbol source 124, for example, performing one or more of pulse shaping, subcarrier multiplexing, chromatic dispersion pre-compensation, and distortion pre-compensation on the symbols. The DSP 126 is operative to generate I and Q digital drive signals 128, 129 for the X-polarization to be converted by DACs 130, 131, respectively, into I and Q analog drive signals 132, 133 for the X-polarization that, after amplification by respective amplifiers 134, 135, are used to drive the electrical-to-optical modulator 112. The DSP 126 is operative to generate I and Q digital drive signals 136, 137 for the Y-polarization to be converted by DACs 138, 139, respectively, into I and Q analog drive signals 140, 141 for the Y-polarization that, after amplification by respective amplifiers 142, 143, are used to drive the electrical-to-optical modulator 114. Each of the DACs 130, 131, 138, 139 is operative to produce a high-bandwidth analog signal having a sample period of T. In some implementations, the DSP 126 and the DACs 130, 131, 138, 139 are comprised in a complementary metal-oxide-semiconductor (CMOS) module, and the amplifiers 134, 135, 142, 143 are comprised in a bipolar CMOS (BiCMOS) module.

In general, a DAC is configured to convert a digital input x into an analog output X using a plurality of switchable current sources (i.e., current sources controlled by respective switches). A current source may comprise a direct current source, or may be realized by a voltage reference and a resistor. High-speed applications often employ current-steering DACs, which use metal-oxide semiconductor field-effect transistors (MOSFETS) as the switchable current sources. The technology presented herein is described in the context of current-steering DACs, but may be applied to any DAC architecture comprising switchable current sources. The DAC architectures described in this document may be used in devices such as the optical transmitter 100, or any other type of electronic apparatus that is configured for digital-to-analog conversion.

A DAC may be characterized by a basis length L, which denotes the number of switchable current sources comprised in the DAC. A DAC of basis length L comprises L current sources which are weighted by L respective weights $B_i$, for i=1 . . . L. The relationship between the digital input x and the analog output X may be expressed as:

$$X = W^T(x) B \quad [1]$$

where $W^T(x)$ denotes the transpose of a binary vector $W(x)$ of size L which is a function of the digital input x, and where B is a vector of length L comprising the weights of the L current sources, herein referred to as a basis vector. The binary vector $W(x)$ may be understood as a set of L signals used to control the L switches. Given a digital input x comprising N bits, where N is a positive integer, the architecture of the DAC (including the binary vector $W(x)$ and the basis vector B) is designed to have a resolution of $2^N$, meaning that the DAC outputs an analog output X that uniquely represents any one of the $2^N$ possible values of the digital input x. Various DAC architectures may be used to achieve this. The following examples involve a digital input x comprising N=8 bits, but other examples are contemplated.

FIG. 2 illustrates a DAC architecture 200 in accordance with an example of PRIOR ART. The DAC architecture 200 has unary weighting, meaning that the current sources have identical weights. This type of architecture may also be referred to as a thermometer-coded DAC. In this case, the current sources comprise unit current sources 202, such that $B_i=1$ for i=1 . . . L. With a unary-weighted DAC, a basis length of $L=2^N-1$ is used to convert an N-bit digital input to a $2^N$-level analog output. Thus, for a given digital input 204 comprising N=8 bits, L=255 unit current sources 202 are controlled by L=255 respective switches (denoted by S1, . . . , S255) to generate an analog output 206 that is representative of the digital input 204. The 255 switches are controlled by 255 bits 208 generated by an 8-to-255 decoder 210 based on the 8-bit digital input 204. In this example, the analog output 206 is the voltage measured across a resistor 212. The bits 208 used to control the switches may be represented by the binary vector W in Equation 1. It will be apparent that there is redundancy in the unary-weighted DAC architecture 200. That is, multiple different binary vectors W may be used to generate the same analog output 206. For this reason, a unary-weighted DAC with $L=2^N-1$ may be described as having a fully over-complete basis.

FIG. 3 illustrates a DAC architecture 300 in accordance with an example of PRIOR ART. The DAC architecture 300 has binary weighting, meaning that the current sources have different weights which, when normalized by their minimum value, form a basis vector B=[1, 2, 4, 8, . . . , $2^{N-1}$]. According to one example, a non-unit current source may be implemented by a plurality of unit current sources arranged in parallel. For example, a current source of weight 8 may be implemented by 8 parallel unit current sources. With a binary-weighted DAC, a basis of length L=N is used to convert an N-bit digital input to a $2^N$-level analog output. Thus, for the digital input 204 comprising N=8 bits, L=8 weighted current sources 302 having respective weights B=[1, 2, 4, 8, 16, 32, 64, 128] are controlled by L=8 respective switches (denoted by S1, . . . , S8) to generate an analog output 306 that is representative of the digital input 204. The 8 switches are controlled directly by the 8 bits of the digital input 204, with the least significant bit (LSB) controlling the switch S1 (which in turn controls the current source having the lowest weight, $B_1$=1), and with the most significant bit (MSB) controlling the switch S8 (which in turn controls the current source having the highest weight, $B_8$=128). There is no redundancy in the binary-weighted DAC architecture 300. That is, any given analog output 306 may be generated using only one binary vector W (corresponding to the 8-bit digital input 204). For this reason, a binary-weighted DAC with L=N may be described as having a complete basis.

Unary-weighted DACs may achieve excellent performance with little distortion, but this is at the expense of circuit area and complexity. Binary-weighted DACs take up less space and have lower complexity than unary DACs, but may suffer from significant distortions. For example, the 8-bit binary-weighted DAC architecture 300 comprises only eight switchable current sources (compared to the 255 switchable current sources required to implement the 8-bit unary-weighted DAC architecture 200), but may be less accurate due to the high precision required for each individual current source. A hybrid between a unary-weighted DAC and a binary-weighted DAC, herein referred to as a segmented DAC, may be used to balance complexity with performance. Examples of segmented DAC architectures are described by Versterbacka in "Linear-Coded D/A Converters with Small Relative Error Due to Glitches," *Proceedings of the 44th IEEE* 2001 *Midwest Symposium on Circuits and Systems. MWSCAS* 2001, vol. 1, August 2001; and by Tesch et al. in "A Low Glitch 14-b 100-MHz D/A Converter," *IEEE Journal of Solid-State Circuits*, vol. 32, no. 9, September 1997.

FIG. 4 illustrates a segmented DAC architecture 400 in accordance with an example of PRIOR ART. The DAC architecture 400 comprises a combination of binary-weighted current sources and unary-weighted current sources, where the binary weighting is used for lower-order or least significant bits (LSBs) and the unary weighting is used for higher-order or most significant bits (MSBs). This type of segmented architecture may be realized in various ways, depending on how many bits are treated as LSBs and how many bits are treated as MSBs. In this example, two bits of the 8-bit digital input 204 are classified as MSBs, while the remaining six bits are classified as LSBs. For the six LSBs 412, six binary-weighted current sources 404 having respective weights B=[1, 2, 4, 8, 16, 32] are controlled by six respective switches (denoted by S1, . . . , S6). The least significant of the six LSBs 412 (i.e., the least LSB or LLSB) controls the switch S1 (which in turn controls the current source having the lowest weight, $B_1$=1), and the most significant of the six LSBs 412 (i.e., the most LSB or MLSB) controls the switch S6 (which in turn controls the current source having the highest weight, $B_6$=32). For the two MSBs of the 8-bit digital input 204, three unary-weighted current sources 402 are controlled by switches S7, S8, S9, respectively. The switches S7, S8, S9 are in turn are controlled by bits 408 generated by a 2-to-3 decoder 410 based on the two MSBs. Each of the unary-weighted current sources 402 has an identical weight that is a factor of two greater than highest weight of the binary-weighted current sources 404. Thus, since $B_6$=32, it follows that $B_7$=$B_8$=$B_9$=64. A segmented DAC has an over-complete basis with some redundancy, where N<L<$2^N$−1. The segmented architecture may offer a tradeoff between the advantages and disadvantages of the unary- and binary-weighted implementations. For example, the 8-bit segmented DAC architecture 400 (which comprises only nine switches) may achieve better performance than the 8-bit binary DAC architecture 300, but without the complexity of the 8-bit unary DAC architecture 200 (which comprises 255 switches).

The performance of current-steering DACs, such as those illustrated in FIGS. 2, 3, and 4 may be degraded by distortions caused by mismatches or inconsistencies between circuit components/elements. For example, when there is a transition from a first digital input x to a second digital input y, a DAC may briefly generate an analog output that is representative of some value other than x or y. This type of transient nonlinear distortion, herein referred to as a glitch error, may result from differences between rise/fall asymmetry within the switches and/or timing offsets between the switches. Such distortion sources may also be excited through a specific pattern of consecutive ON/OFF transitions for a specific current switch. For example, a specific pattern of ON-OFF-ON for a current switch may generate a different distortion source than a pattern of OFF-OFF-ON. In another example, signal degradation may arise from amplitude mismatches of the currents generated by the switchable current sources, which may impact static performance of the DAC. Current amplitude mismatch errors may be a dominant source of impairment in low speed applications, while glitch errors may have a higher impact as the data rate increases. Rise/fall asymmetry, current amplitude differences, and timing offsets between switchable current sources are examples of circuit component mismatches that may result in DAC distortion.

DAC distortion may be reduced using various techniques that exploit redundancy in the DAC architecture. For example, dynamic element matching (DEM) techniques have been shown to significantly improve the spurious free dynamic range (SFDR), (see, for example, Shen et al., "Random Swapping Dynamic Element Matching Technique for Glitch Energy Minimization in Current-Steering DAC," *IEEE Transactions on Circuits and Systems II. Express Briefs*, vol. 57, no. 5, pp. 369-373, 2010; Vesterbacka et al., "Dynamic Element Matching in D/A Converters with Restricted Scrambling," in ICECS 2000, 7th *IEEE International Conference on Electronics, Circuits and Systems*, vol. 1, 2000; Baird et al., "Linearity Enhancement of Multibit ΔE A/D and D/A Converters Using Data Weighted Averaging," *IEEE Transactions on Circuits and Systems II. Analog and Digital Signal Processing*, vol. 42, no. 12, 1995; Galton, "Why Dynamic-Element-Matching DACs Work," *IEEE Transactions on Circuits and Systems II: Express Briefs*, vol. 57, no. 2, 2010; Rudberg et al., "Glitch Minimization and Dynamic Element Matching in D/A Converters," in ICECS 2000. 7th *IEEE International Conference on Electronics,*

Circuits and Systems, vol. 2, 2000). However, such techniques have not improved the signal-to-noise distortion ratio (SNDR). In another example, mapping algorithms that use amplitude errors or timing errors to determine an optimized mapping of unary-weighted current sources or cells have been shown to improve performance (see, for example, Nakamura et al., "A 10-b 70-MS/s CMOS D/A Converter," *IEEE Journal of Solid-State Circuits*, vol. 26, no. 4, 1991; Bastos et al., "A 12-bit Intrinsic Accuracy High-Speed CMOS DAC," *IEEE Journal of Solid-State Circuits*, vol. 33, no. 12, 1998; Van Der Plas et al., "A 14-bit Intrinsic Accuracy $Q^2$ Random Walk CMOS DAC," *IEEE Journal of Solid-State Circuits*, vol. 34, no. 12, 1999; Cong et al., "Switching Sequence Optimization for Gradient Error Compensation in Thermometer-Decoded DAC Arrays," *IEEE Transactions on Circuits and Systems II: Analog and Digital Signal Processing*, vol. 47, no. 7, 2000). However, such techniques are complex and have high power consumption.

There remains a need for DAC architectures that are capable of high performance (i.e., low distortion) but with low complexity, low power consumption, and small footprint.

In accordance with some examples of the technology described herein, efficient DAC architectures are proposed based on the minimization of various statistical error metrics. The proposed DAC architectures may achieve similar performance to segmented DACs but using fewer switches than the segmented DACs. Three types of errors are considered in the examples below: (1) glitch errors arising from rise/fall asymmetry; (2) static errors arising from current amplitude mismatches; and (3) glitch errors arising from timing offsets. However, it should be understood that DAC architectures may be designed by minimizing other statistical error metrics.

In each of the following examples, the optimized DAC architectures are designed to have an over-complete basis, where $N<L<2^N-1$. However, in contrast to a segmented architecture, where one portion of the current sources are unary-weighted and the other portion of the current sources are binary-weighted, all of the current sources in the proposed DAC architectures have weights configured to minimize a statistical error metric associated with the analog output of the DAC.

Glitch Errors Arising from Rise/Fall Asymmetry

Glitch errors may be caused by rise/fall asymmetry within the switches of the DAC, that is, differences between the current response to a switch transitioning from OFF (or OPEN) to ON (or CLOSED) (i.e., the transient rise of the current) and the current response to the switch transitioning from ON to OFF (i.e., the transient fall of the current).

Figure 5:
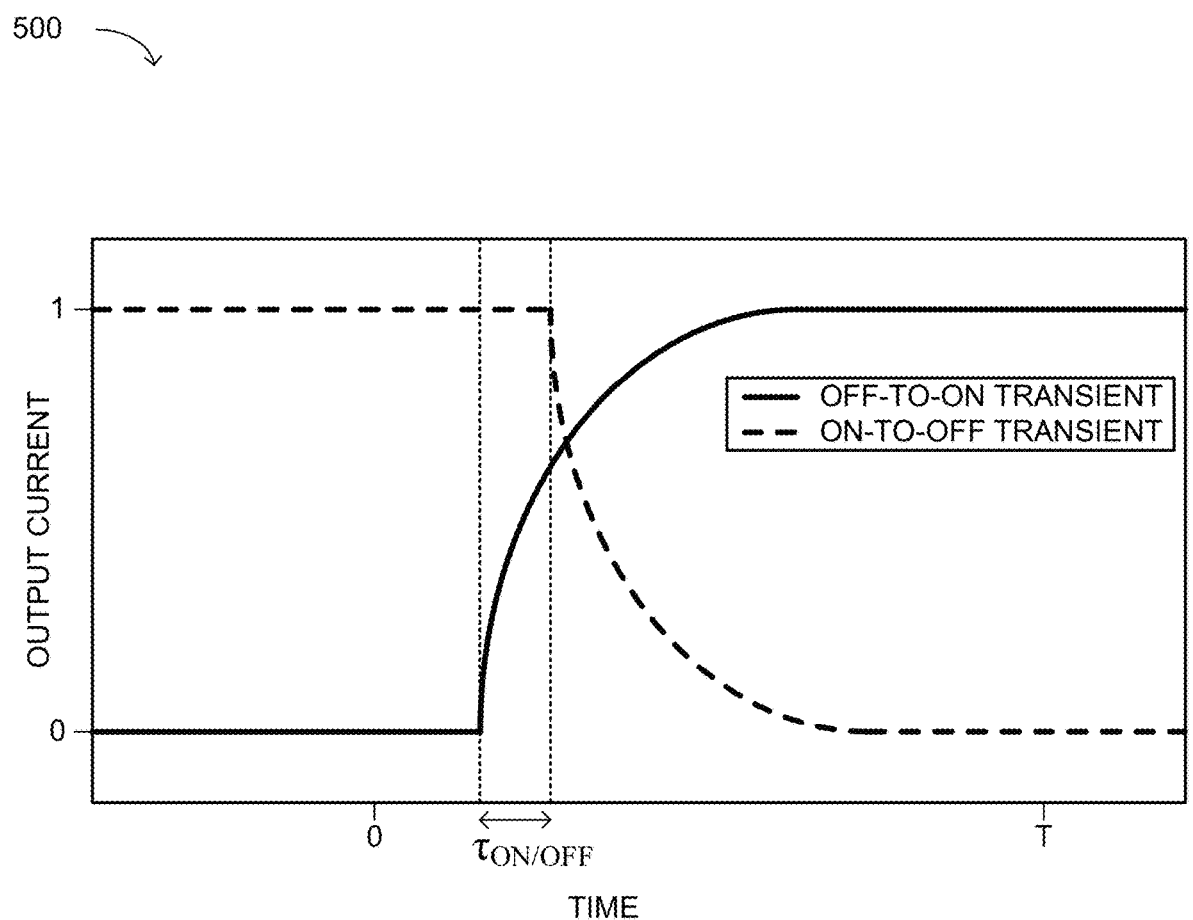
FIG. 5 illustrates a plot of rise/fall asymmetry in a switchable current source in accordance with some examples.

FIG. 5 illustrates a plot 500 of rise/fall asymmetry in a switchable current source in accordance with some examples. The solid line shows the output current of the switchable current source resulting from a transition of the switch from OFF to ON, and the dashed line shows the output current of the switchable current source resulting from a transition of the switch from ON to OFF. For the purposes of the following example, it is assumed that all the switchable current sources of the DAC exhibit the same settling transients (i.e., the shapes of the two curves are identical), but that there is a static time offset TON/OFF between the OFF-to-ON transient and the ON-to-OFF transient, where the value of TON/OFF represents the rise/fall asymmetry. It is also assumed that each switchable current source is characterized by the same value of TON/OFF. As a result of the rise/fall asymmetry, a transition from a first digital input x to a second digital input y may cause the DAC to briefly generate an analog output that is representative of some value other than x or y (i.e., a glitch error).

The DAC architecture may be configured to minimize the power of glitch errors that arise from rise/fall asymmetry in the responses of the switchable current sources. In "Modeling Glitches due to Rise/Fall Asymmetry in Current-Steering Digital-to-Analog Converters," *IEEE Transactions on Circuits and Systems I: Regular Papers*, vol. 52, no. 11, pp. 2265-2275, November 2005, Andersson et al. proposed the following metric for glitch errors caused by rise/fall asymmetry:

$$e_1(x,y)=|W^T(y)-W^T(x)|B \qquad [2]$$

where x and y denote two different digital inputs, each comprising N bits, where N is a positive integer, where $W^T(x)$, $W^T(y)$ denote the transpose of binary vectors $W(x)$, $W(y)$, respectively, each of size L, which are functions of x, y, respectively, where B denotes a basis vector of size L (containing the weights of all current sources in the DAC), and where $N<L<2^N-1$.

The expected value of glitch error power or mean squared error (MSE) may be expressed as:

$$\mathbb{E}\left[|e_1|^2\right] = \qquad [3]$$
$$\sum_{x=0}^{2^N-1} \sum_{y=0}^{2^N-1} Pr(x,y) \sum_{W(x) \in R(x)} Pr(W(x)) \min_{W(y) \in R(y)} (e_1(x,y))^2$$

where $R(x)$ denotes the set of all possible representations for the digital input x, $R(y)$ denotes the set of all possible representations for the digital input y, where $Pr(x,y)$ is the transition probability from the digital input x to the digital input y, and where $Pr(W(x))$ is the probability distribution of representations of the digital input x.

For a selected basis length L satisfying $N<L<2^N-1$, the DAC architecture may be optimized by determining the weights $B_{OPT}$ that minimize the expected glitch error power $\mathbb{E}[e_1|^2]$. This optimization, which may be expressed as:

$$B_{OPT} = \underset{B}{\mathrm{argmin}}\left(\mathbb{E}\left[|e_1|^2\right]\right) \qquad [4]$$

is a nonlinear, non-convex, discrete problem, where the dimension of the search space is L and each element has an integer value in the range $1 \ldots 2^N$. Thus, the maximum size of the search space is $2^{NL}$, which grows exponentially with both N and L. Consequently, it may be impractical to do an exhaustive search (unless the values of L and N are small). According to some examples, the optimized basis vector $B_{OPT}$ for basis length L may be computed using a differential evolution (DE) optimization algorithm, for example, as described by Storn et al. in "Differential Evolution—A Simple and Efficient Heuristic for Global Optimization over Continuous Spaces," *Journal of Global Optimization*, vol. 11, no. 4, 1997. A computer simulation was performed wherein a DE optimization algorithm was used to determine the optimized basis vector $B_{OPT}$ of an 8-bit DAC for different basis lengths L=9, 10, 11, 12, and 13. The optimization assumed a white Gaussian noise input signal, with the root mean square (RMS) of the input signal being set to the optimal value that achieves maximum signal-to-quantization ratio (SQNR). Monte Carlo simulations were used to determine the optimal RMS of the input signal by sweeping the RMS and measuring the corresponding SQNR of the DAC. The DE optimization algorithm was repeated 100 times and the best basis vector $B_{OPT}$ (i.e., the one that achieved the lowest glitch error power) for each basis length L is shown in Table 1, where the weights in each vector $B_{OPT}$ are normalized by the minimum weight. In each case, it will be apparent that the sum of the normalized weights is $2^8-1=255$. The optimized basis vectors $B_{OPT}$ in Table 1 are configured to minimize glitch errors caused by rise/fall asymmetry.

TABLE 1

| Basis Length L | Optimized Basis Vector $B_{OPT}$ |
|---|---|
| 9 | [1, 2, 4, 8, 16, 31, 43, 69, 81] |
| 10 | [1, 2, 4, 8, 16, 21, 31, 39, 62, 71] |
| 11 | [1, 2, 4, 8, 13, 18, 26, 30, 38, 54, 61] |
| 12 | [1, 2, 4, 8, 11, 16, 20, 25, 27, 35, 48, 58] |
| 13 | [1, 2, 4, 7, 9, 15, 16, 19, 22, 26, 38, 42, 54] |

FIG. 6 illustrates an 8-bit DAC architecture 600 having the optimized basis vector $B_{OPT}$ for the basis length L=9, as expressed in Table 1. Nine weighted current sources 602 having respective optimized weights $B_{OPT}$=[1, 2, 4, 8, 16, 31, 43, 69, 81] are controlled by nine respective switches (denoted by S1, . . . , S9) to generate an analog output 606 that is representative of the 8-bit digital input 204. The nine switches are controlled by nine bits 608 generated by an 8-to-9 decoder 610 based on the 8-bit digital input 204.

FIG. 7 illustrates an 8-bit DAC architecture 700 having the optimized basis vector $B_{OPT}$ for the basis length L=12, as expressed in Table 1. Twelve weighted current sources 702 having respective optimized weights $B_{OPT}$=[1, 2, 4, 8, 11, 16, 20, 25, 27, 35, 48, 58] are controlled by 12 respective switches (denoted by S1, . . . , S12) to generate an analog output 706 that is representative of the 8-bit digital input 204. The 12 switches are controlled by 12 bits 708 generated by an 8-to-12 decoder 710 based on the 8-bit digital input 204.

It should be noted that the values of the optimized weights $B_{OPT}$ may differ depending on the choice of application and design parameters. For example, a different input signal distribution (e.g., uniform) or a different number of repetitions of the DE algorithm may result in different optimized basis vectors $B_{OPT}$ than those provided in Table 1.

In general, an optimized DAC architecture, such as the 8-bit DAC architectures 600 and 700, comprises an N-to-L decoder which maps or converts the N-bit digital input x to an L-bit representation of the digital input W(x). The N-to-L decoder may also be referred to as a mapping. Since the optimized DAC architecture has an over-complete basis, there may exist multiple different representations W(x) for a given N-bit digital input x. For example, referring to FIG. 6, the same output current 606 may be generated when the nine signals 608 have respective values 000100000 or 000011111, since 16+8+4+2+1=31. The mapping of the decoder dictates which representation W(x) is to be used for each input x.

According to some examples, the mapping of the N-to-L decoder may be configured to minimize or reduce errors in the analog output of the DAC. For example, given the optimized basis vector $B_{OPT}$ and an input sequence x[j], for j=0 . . . M−1, where M is a positive integer, it may be of interest to determine the representations W(x[j]) that minimize the expected glitch error power caused by rise/fall asymmetry. The optimized representations $W_{OPT}$(x[j]) may be determined by solving the expression:

$$W_{OPT}(x[j]) = \underset{W(x[j])}{\operatorname{argmin}} \sum_{m=1}^{M-1} (e_1(x[m-1], x[m]))^2, \qquad [5]$$

for $j = 0 .. M - 1$.

Equation 5 may be solved using different techniques of varying complexity. In one example, a dynamic programming algorithm, such as the Viterbi algorithm, may be used to determine the optimized representations $W_{OPT}$ (where the Viterbi algorithm is described, for example, by Proakis et al. in "Digital Communications", Boston, McGraw-Hill, 2008). The complexity of this algorithm increases exponentially with L-N.

In another example, the optimized representations $W_{OPT}$ may be determined using a greedy "best next" algorithm which selects the best representation for x[j] based only the previous sample, expressed as:

$$W_{OPT}(x[j]) = \underset{W(x[j])}{\operatorname{argmin}} (e_1(x[j-1], x[1]))^2, \text{ for } j = 0 .. M - 1. \qquad [6]$$

This approach, which uses sequential processing of samples, may be implemented through look-up tables (LUTs), where each LUT has a size of $2^{N+L}$. For a given LUT, the index/address within the LUT is determined by the representation W(x[j−1]) of the previous input x[j−1] and by the current input value x[j], and the contents of that index/address is the representation W(x[j]) of the current input x[j].

In yet another example, Equation 5 may be solved with a less sophisticated algorithm that uses only a single representation for each input value. In this case, the optimization problem may be solved iteratively such that, at each step, the representations for all inputs are fixed, and the optimized representation for x, $W_{OPT}$(x), is determined as follows:

$$W_{OPT}(x) = \underset{W(x)}{\operatorname{argmin}} \sum_{y=0}^{2^N-1} Pr(x, y)(|W_{OPT}^T(y) - W^T(x)|B)^2. \qquad [7]$$

The application of Equation 7 may be repeated for each value of x to determine the best representations for all values of x. The whole process may also be reiterated until the solutions remain unchanged from one iteration to the next.

Figure 8:
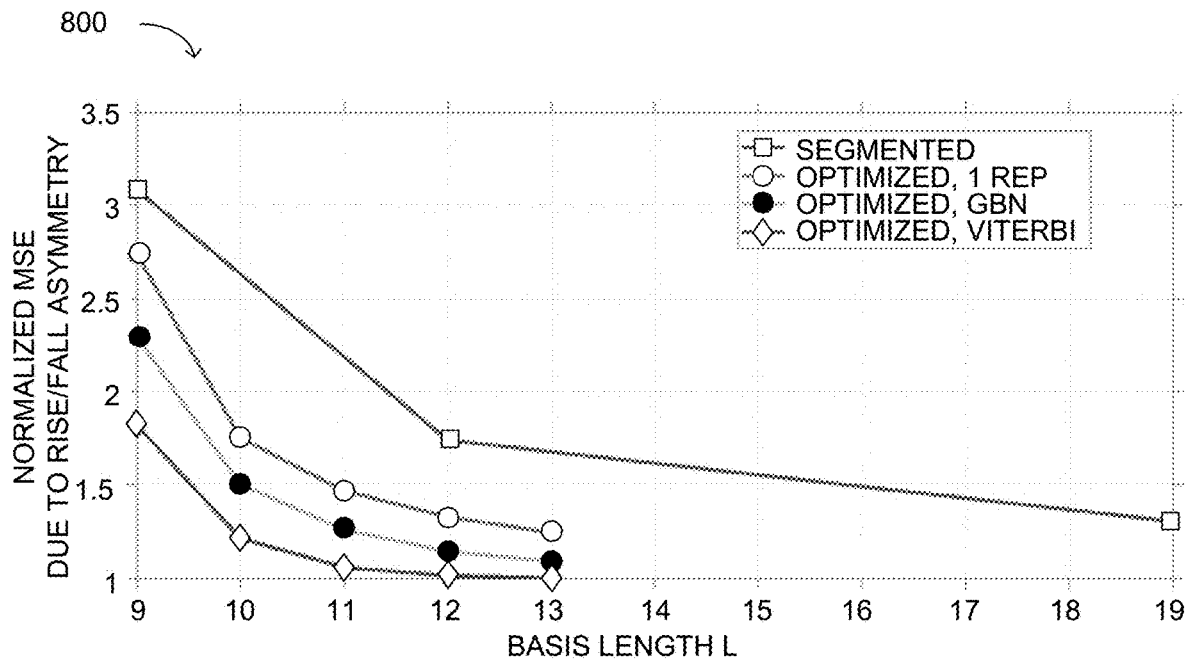
FIG. 8 illustrates a plot of normalized mean squared error (MSE) due to rise/fall asymmetry as a function of basis length for several optimized DAC architectures in accordance with some examples of the proposed technology, relative to several segmented DAC architectures.
Figure 9:
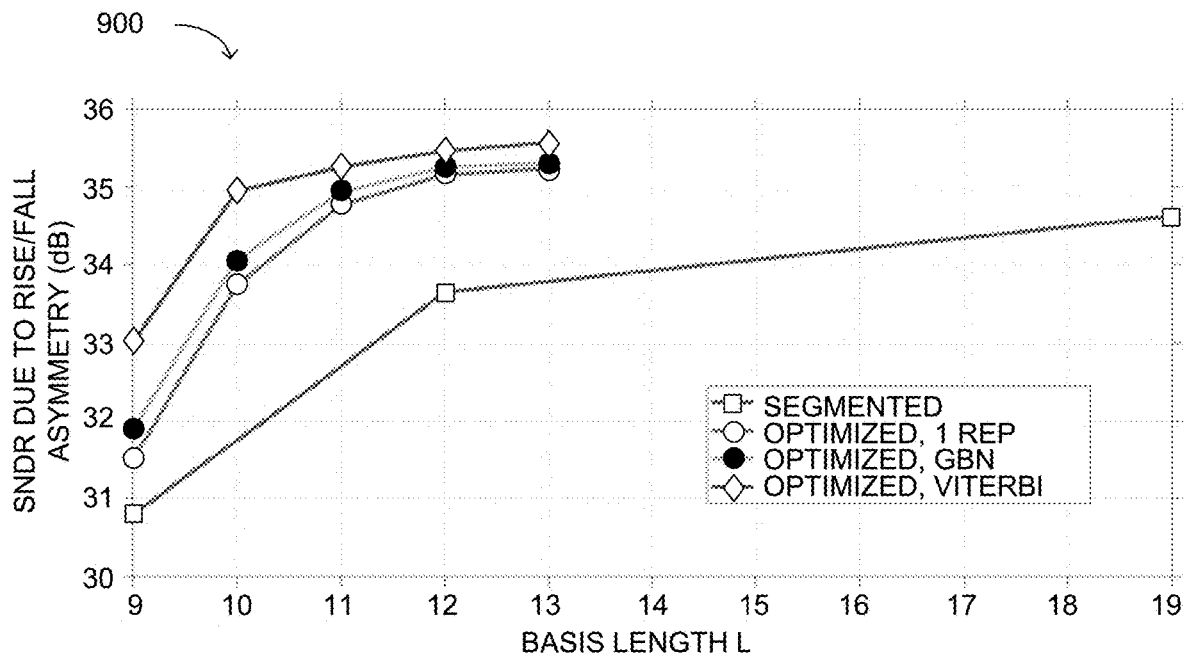
FIG. 9 illustrates a plot of signal-to-noise-distortion ratio (SNDR) due to rise/fall asymmetry as a function of basis length for several optimized DAC architectures in accordance with some examples of the proposed technology, relative to several segmented DAC architectures.

FIGS. 8 and 9 illustrate plots 800 and 900 of normalized MSE and signal-to-noise distortion ratio (SNDR), respectively, due to rise/fall asymmetry as a function of basis length for several optimized 8-bit DAC architectures in accordance with some examples of the proposed technology, relative to several segmented 8-bit DAC architectures. In each instance, the normalized MSE has been normalized by the MSE associated with a unary-weighted 8-bit DAC.

The results in FIGS. 8 and 9 were obtained using simulations. The optimized 8-bit DAC architectures used the optimized basis vectors $B_{OPT}$ as provided in Table 1 for basis lengths L=9, 10, 11, 12, and 13. For each optimized basis vector $B_{OPT}$, the optimized representations $W_{OPT}$ were determined using three different algorithms: a Viterbi algorithm (VITERBI—diamonds), a greedy best next algorithm (GBN—closed circles), and a single representation algorithm (1 REP—open circles). The MSE and SNDR associated with the various optimized architectures were compared to the MSE and SNDR associated with three different segmented architectures. The segmented architecture of basis length L=9 corresponds to the DAC architecture 400, wherein the six LSB of the 8-bit digital input are provided to six binary-weighted current sources, and the two MSB of the 8-bit digital input are provided to three unary-weighted current sources. The segmented architecture of basis length L=12 comprises five binary-weighted current sources (for the five LSB of the 8-bit digital input) and seven unary-weighted current sources (for the three MSB of the 8-bit digital input). The segmented architecture of basis length L=19 comprises four binary-weighted current sources (for the four LSB of the 8-bit digital input) and 15 unary-weighted current sources (for the four MSB of the 8-bit digital input).

As is apparent from FIGS. 8 and 9, an optimized architecture (i.e., having the basis vector $B_{OPT}$ as provided in Table 1, for example) may achieve a lower MSE due to rise/fall asymmetry and a higher SNDR than a segmented architecture having the same number of switchable current sources, regardless of which technique is used to determine the optimized representations $W_{OPT}$ for the optimized architecture (i.e., Viterbi, GBN, 1 REP). For example, the performance of the segmented DAC with 12 switchable current sources is exceeded by that of the optimized DAC architecture comprising 12 switchable current sources.

It is also apparent from FIGS. 8 and 9 that an optimized architecture may achieve a similar or better performance than a segmented architecture having more switchable current sources. For example, the performance of the 10-switch optimized architecture (when the optimized representations $W_{OPT}$ have been determined using the Viterbi algorithm) exceeds the performance of the 19-switch segmented DAC. Even when the optimized representations $W_{OPT}$ have been determined using less complicated algorithms, the performance of the 19-switch segmented DAC may still be either matched or exceeded by an optimized DAC architecture that comprises fewer switchable current sources. Advantageously, a decrease in the number of switchable current sources may allow for a decrease in the overall chip size.

Although not explicitly shown, the simulations also demonstrated that the impact of rise/fall asymmetry on SFDR in the optimized DAC was comparable to the impact in a unary-weighted DAC (or a 19-switch segmented DAC).

The optimized representations $W_{OPT}$ were determined based on modeling of statistical error metrics. However, it is also contemplated that the optimized representations $W_{OPT}$ may be determined using real measurements of rise/fall asymmetry in a given DAC.

Static Errors Arising from Current Amplitude Mismatches

Mismatches between the amplitudes of the currents generated by the switchable current sources of the DAC may contribute to signal degradation. The DAC architecture may be configured to minimize the power of errors that arise from current amplitude mismatches between the switchable current sources of the DAC.

Figure 10:
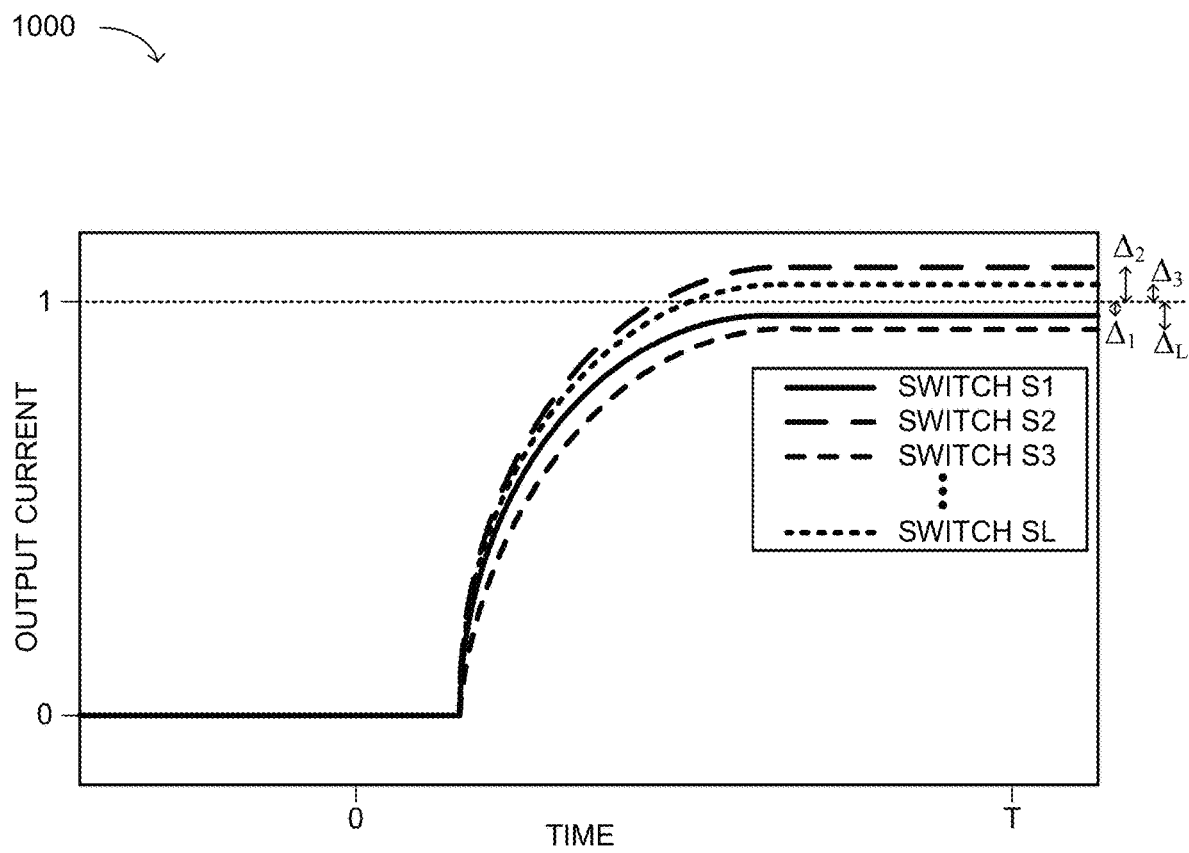
FIG. 10 illustrates a plot of current amplitude mismatches between switchable current sources in accordance with some examples.

FIG. 10 illustrates a plot 1000 of current amplitude mismatches between switchable current sources in accordance with some examples. The current amplitude errors associated with the L current sources may be denoted by a vector $\Delta$ of size L, where the current amplitude error associated with the $i^{th}$ current source is denoted by $\Delta_i$, for i=1 . . . L. In the following example, the mismatch for the $i^{th}$ current source is statistically modeled as an uncorrelated Gaussian random variable with a standard deviation of $\sqrt{B_i}\sigma\delta$, where $\sigma_\delta$ denotes the standard deviation of the unit current source (corresponding to the LSB). For a digital input x, the current mismatch may cause an error $e_m(x)$ at the receiver expressed as:

$$e_2(x) = \sum_{i=1}^{L} \left( W_i(x) - \sum_{x=0}^{2^N-1} Pr(x)W_i(x) \right) \Delta_i \quad [8]$$

where $W_i(x)$ denotes the $i^{th}$ element of the binary vector $W(x)$, where $W(x)$ satisfies Equation 1, and where $Pr(x)$ is the probability distribution of the digital input x.

The MSE as a result of the current amplitude errors $\Delta$ for the digital input x may be expressed as:

$$\mathbb{E}[|e_2|^2] = \sigma_\delta^2 \sum_{i=1}^{L} \sum_{x=0}^{2^N-1} Pr(x)W_i(x)\left(1 - \sum_{x=0}^{2^N-1} Pr(x)W_i(x)\right)B_i. \quad [9]$$

The representations $W_i(x)$ for i=1 . . . L used in Equation 9 may influence the performance of the DAC. Determining the optimized set of representations $W_{OPT}$ for all values of x is a discrete non-convex optimization problem that becomes more computationally expensive as L increases. An iterative approach may be used to determine the optimized representations $W_{OPT}(y)$. According to this approach, for a given basis vector B, all representations W are calculated for each input value x; $W_{OPT}(x)$ is initialized with a random representation for x=0 . . . $2^N-1$; and for each input value y, a global search is used to select the optimized representation $W_{OPT}(y)$ according to the expression:

$$W_{OPT}(y) = \quad [10]$$
$$\underset{W(y)}{\mathrm{argmin}} \sum_{i=1}^{L} \sum_{x=0}^{2^N-1} Pr(x)W_{OPT,i}(x)\left(1 - \sum_{x=0}^{2^N-1} Pr(x)W_{OPT,i}(x)\right)B_i.$$

The search step may be repeated for a predetermined number of iterations or until $W_{OPT}(y)$ remains the same, whichever occurs first.

For a selected basis length L satisfying $N<L<2^N-1$, the DAC architecture may be optimized by determining the weights $B_{OPT}$ that minimize the MSE in Equation 9. This optimization problem may be expressed as:

$$B_{opt} = \quad [11]$$
$$\underset{B}{\mathrm{argmin}}\left(\underset{\substack{W(x,B) \\ 0 \le x < 2^N}}{\mathrm{argmin}} \sum_{i=1}^{L} \sum_{x=0}^{2^N-1} Pr(x)W_i(x)\left(1 - \sum_{x=0}^{2^N-1} Pr(x)W_i(x)\right)B_i\right),$$

where the notation $W(x,B)$ highlights that each binary vector W is a function of the basis vector B. According to some examples, the optimized basis vector $B_{OPT}$ for basis length L may be computed using simulated annealing.

A computer simulation was performed wherein a simulated annealing algorithm was used to determine the optimized basis vector $B_{OPT}$ of an 8-bit DAC for different basis lengths L=9, 10, 11, 12, 13, 14, and 15. The simulated annealing algorithm was run 100 times and the best basis vector $B_{OPT}$ (i.e., the one that achieved the lowest current amplitude mismatch error) for each basis length L is shown in Table 2, where the weights in each vector $B_{OPT}$ are normalized by the minimum weight. In each case, it will be apparent that the sum of the normalized weights is $2^8-1=255$. The optimized basis vectors $B_{OPT}$ in Table 2 are configured to minimize errors caused by current amplitude mismatch.

TABLE 2

| Basis Length L | Optimized Basis Vector $B_{OPT}$ |
|---|---|
| 9 | [1, 2, 4, 8, 16, 32, 35, 77, 80] |
| 10 | [1, 2, 4, 8, 16, 17, 32, 33, 70, 72] |
| 11 | [1, 2, 4, 8, 8, 16, 17, 32, 33, 66, 70] |
| 12 | [1, 2, 4, 7, 8, 15, 15, 23, 25, 30, 61, 64] |
| 13 | [1, 2, 4, 6, 8, 9, 12, 16, 17, 25, 32, 61, 66] |
| 14 | [1, 2, 4, 4, 9, 9, 13, 14, 15, 22, 25, 25, 53, 59] |
| 15 | [1, 2, 4, 4, 7, 8, 13, 13, 14, 15, 17, 24, 28, 54, 55] |

It is noted that different simulation parameters may result in different values for the optimized weights $B_{OPT}$ than those provided in Table 2.

In Equation 10, the optimized representations $W_{OPT}(y)$ are calculated based on the minimization of the statistical error power (i.e., the expected error variance over many DAC samples). However, real measurements of the current amplitude error $\Delta_i$ in a given DAC may be used to determine optimized representations $\hat{W}_{OPT}(x)$ as follows:

$$\hat{W}_{OPT}(x) = \underset{W(x) \in R(x)}{\mathrm{argmin}} \left| \sum_{i=1}^{L} W_i(x) \Delta_i \right|^2 \quad [12]$$

Figure 11:
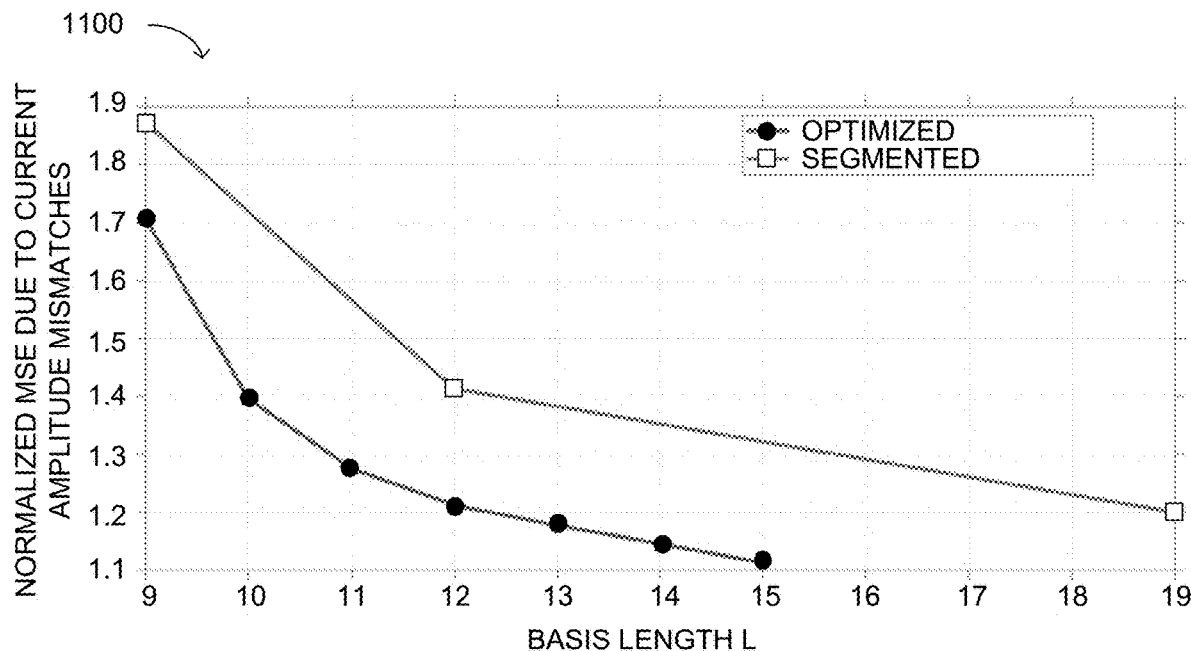
FIG. 11 illustrates a plot of normalized MSE due to current amplitude mismatches as a function of basis length for several optimized DAC architectures in accordance with some examples of the proposed technology, relative to several segmented DAC architectures.
Figure 12:
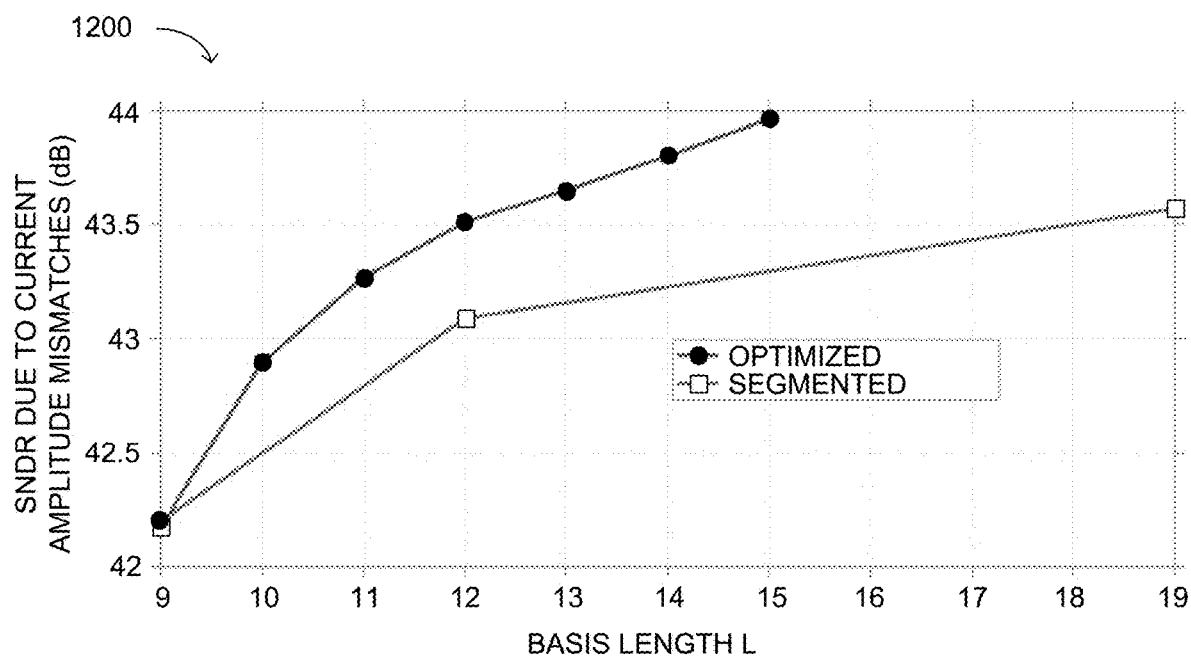
FIG. 12 illustrates a plot of SNDR due to current amplitude mismatches as a function of basis length for several optimized DAC architectures in accordance with some examples of the proposed technology, relative to several segmented DAC architectures.

FIGS. 11 and 12 illustrate plots 1100 and 1200 of normalized MSE and SNDR, respectively, due to current amplitude mismatch as a function of basis length for several optimized 8-bit DAC architectures in accordance with some examples of the proposed technology, relative to several segmented 8-bit DAC architectures. In each instance, the normalized MSE has been normalized by the MSE associated with a unary-weighted 8-bit DAC.

The results in FIGS. 11 and 12 were obtained using simulations. The optimized 8-bit DAC architectures used the optimized basis vectors $B_{OPT}$ as provided in Table 2 for basis lengths L=9, 10, 11, 12, 13, 14, and 15. For each optimized basis vector $B_{OPT}$, the optimized representations $W_{OPT}$ were determined using simulated annealing. Current amplitude mismatches were assumed to have an uncorrelated Gaussian distribution. The MSE and SNDR associated with the various optimized architectures were compared to the MSE and SNDR associated with three different segmented architectures, as described previously with respect to FIGS. 8 and 9.

As is apparent from FIGS. 11 and 12, an optimized architecture (i.e., having the basis vector $B_{OPT}$ as provided in Table 2, for example) may achieve a lower MSE and a higher SNDR than a segmented architecture having the same number of switchable current sources. For example, the performance of the 12-switch segmented DAC is exceeded by that of the 12-switch optimized DAC architecture.

It is also apparent from FIGS. 11 and 12 that an optimized architecture may achieve a similar or better performance than a segmented architecture having more switchable current sources. For example, the performance of the 12-switch optimized DAC architecture is similar to that of the 19-switch segmented DAC. As noted previously, the ability to achieve similar performance using fewer switchable current sources may be advantageous when chip area is limited.

Glitch Errors Arising from Timing Offsets

In addition to rise/fall asymmetry, glitch errors may also be caused by timing offsets between the switches of the DAC, that is, differences between the transition times (OFF-to-ON and/or ON-to-OFF) of the switches.

Figure 13:
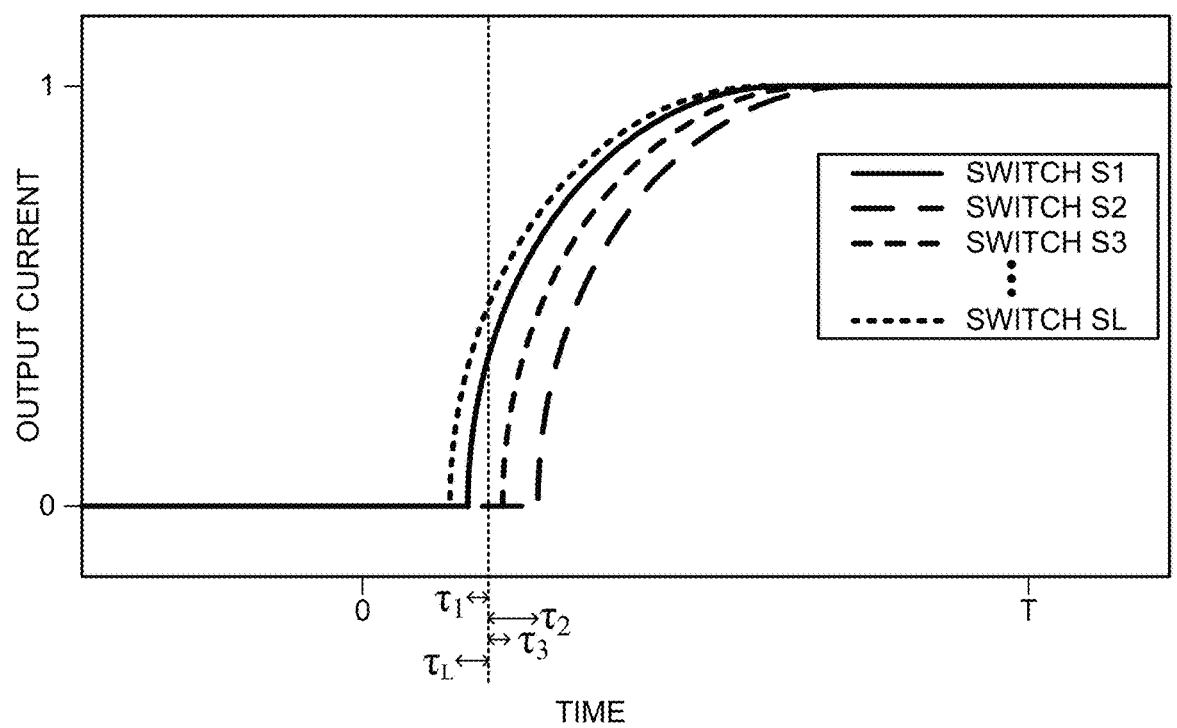
FIG. 13 illustrates a plot of OFF-to-ON timing offsets between switchable current sources in accordance with some examples.

FIG. 13 illustrates a plot 1300 of OFF-to-ON timing offsets between switchable current sources in accordance with some examples. The timing offset (or skew) associated with the OFF-to-ON transition of L switchable current sources may be denoted by a vector $\tau$ of size L, where the timing offset associated with the $i^{th}$ switch is denoted by $\tau_i$, for i=1 ... L, where $\tau_i$ is normalized by the sampling period T and satisfies $-\frac{1}{2} \leq \tau_i \leq \frac{1}{2}$. For a transition from a digital input x to a digital input y, the glitch error caused by timing offset at time t, where $-T/2 < t \leq T/2$, may be expressed as:

$$e_3(t) = \sum_{i=1}^{L} c_i(x, y) B_i \prod \left( \frac{t - \tau_i/2}{|\tau_i|} \right) \mathrm{sgn}(\tau_i) \quad [13]$$

where $c_i(x,y)$ represents the difference between $W_i(y)$ and $W_i(x)$, such that $c_i(x,y) \in \{+1, 0, -1\}$, where sgn is the sign function, and where:

$$\prod(t) = \begin{cases} 0, & |t| > \frac{1}{2} \\ \frac{1}{2}, & |t| = \frac{1}{2} \\ 1, & L|t| < \frac{1}{2} \end{cases} \quad [14]$$

For the transition from x to y, the MSE of the glitch error metric $e_3(t)$ associated with timing offsets may be expressed as:

$$C(x, y) = \frac{1}{T} \mathbb{E}\left[ \int_{-\frac{T}{2}}^{\frac{T}{2}} |e_3(t)|^2 dt \right], \quad [15]$$

For an over-complete basis, the total MSE due to timing offsets may be expressed as:

$$\mathbb{E}[|e_3|^2] = \sum_{x=0}^{2^N-1} \sum_{y=0}^{2^N-1} Pr(x, y) \sum_{W(x) \in R(x)} Pr(W(x)) \underset{W(y) \in R(y)}{\mathrm{argmin}} C(x, y) \quad [16]$$

where R(x) and R(y) denote the set of all possible representations for the inputs x and y, respectively, where Pr(x,y) denotes the transition probability from input x to input y, and where Pr(W(x)) denotes the probability distribution of representations of input x.

For a selected basis length L satisfying $N < L < 2^N - 1$, the DAC architecture may be optimized by determining the weights $B_{OPT}$ that minimize the total MSE. This optimization problem, expressed as:

$$B_{OPT} = \underset{B}{\mathrm{argmin}}(\mathbb{E}[|e_3|^2]), \quad [17]$$

may be simplified by assuming a uniform distribution for Pr(W(x)). According to some examples, the optimized basis vector $B_{OPT}$ for basis length L may be computed using simulated annealing.

A computer simulation was performed wherein a simulated annealing algorithm was used to determine the optimized basis vector $B_{OPT}$ of an 8-bit DAC for different basis lengths L=9, 10, 11, 12, 13, and 14. The simulated annealing algorithm was run 100 times and the best basis vector $B_{OPT}$ (i.e., the one that achieved the lowest glitch error power) for each basis length L is shown in Table 3, where the weights in each vector $B_{OPT}$ are normalized by the minimum weight. In each case, it will be apparent that the sum of the normalized weights is $2^8-1=255$. The optimized basis vectors $B_{OPT}$ in Table 3 are configured to minimize glitch errors caused by timing offset.

TABLE 3

| Basis Length L | Optimized Basis Vector $B_{OPT}$ |
|---|---|
| 9 | [1, 2, 4, 8, 16, 31, 43, 69, 81] |
| 10 | [1, 2, 4, 8, 16, 21, 31, 39, 62, 71] |
| 11 | [1, 2, 4, 8, 13, 18, 26, 30, 38, 54, 61] |
| 12 | [1, 2, 4, 8, 11, 16, 20, 25, 27, 35, 48, 58] |
| 13 | [1, 2, 4, 8, 14, 16, 18, 21, 25, 27, 30, 33, 56] |
| 14 | [1, 2, 4, 8, 12, 13, 14, 15, 18, 21, 26, 31, 35, 55] |

It is noted that different simulation parameters may result in different values for the optimized weights $B_{OPT}$ than those provided in Table 3.

Given the optimized basis vector $B_{OPT}$ and an input sequence x[j], for j=1 ... M−1, it is of interest to determine the representations of x[j] that minimize the expected glitch error power caused by timing offsets. The optimized representations $W_{OPT}$ (x[j]) may be determined by solving the expression:

$$W_{OPT}(x[j]) = \underset{W(x[j])}{\mathrm{argmin}} \sum_{m=1}^{M-1} (C(x[m-1], x[m])), \text{ for } j = 0 .. M\text{-}1 \quad [18]$$

As described with respect to Equation 5, various algorithms may be used to solve Equation 18, including for example, the Viterbi algorithm, the greedy best next algorithm, and the single representation algorithm.

Figure 14:
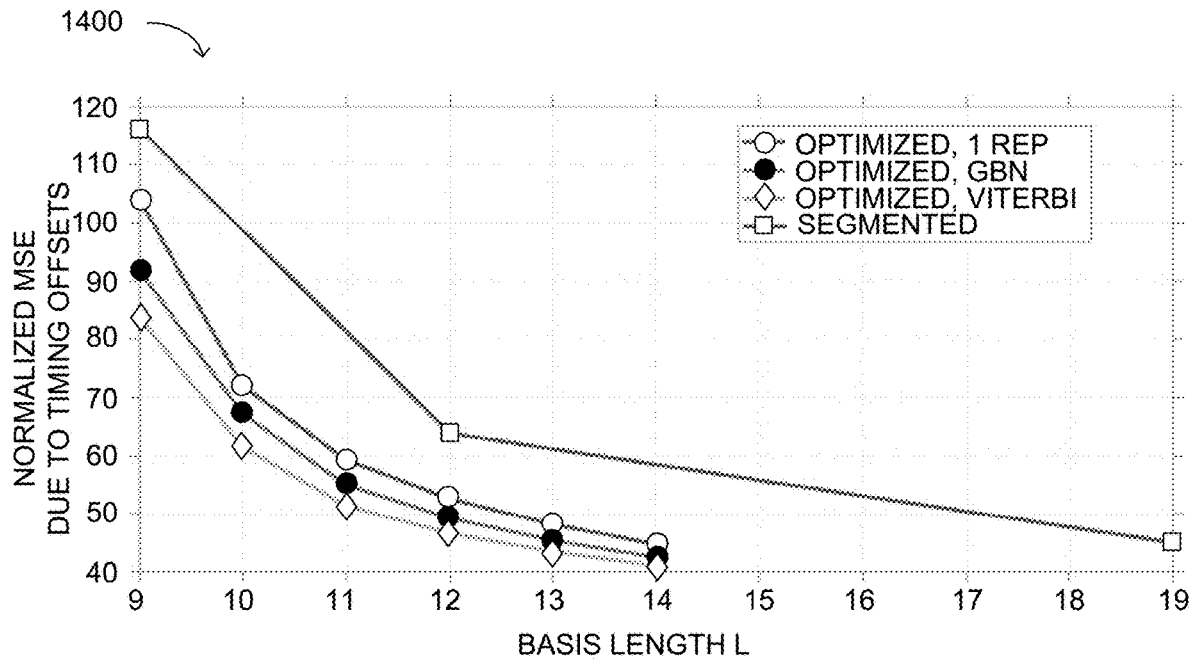
FIG. 14 illustrates a plot of normalized MSE due to timing offsets as a function of basis length for several optimized DAC architectures in accordance with some examples of the proposed technology, relative to several segmented DAC architectures.
Figure 15:
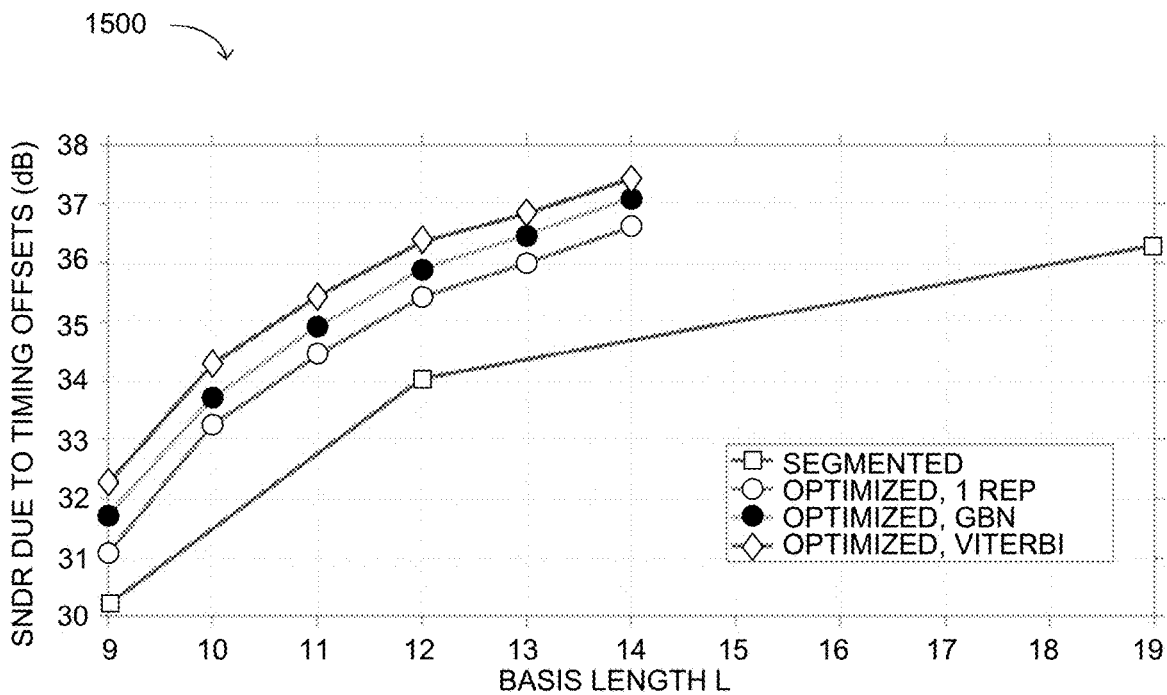
FIG. 15 illustrates a plot of SNDR due to timing offsets as a function of basis length for several optimized DAC architectures in accordance with some examples of the proposed technology, relative to several segmented DAC architectures.

FIGS. 14 and 15 illustrate plots 1400 and 1500 of normalized MSE and SNDR, respectively, due to timing offsets as a function of basis length for several optimized 8-bit DAC architectures in accordance with some examples of the proposed technology, relative to several segmented 8-bit DAC architectures. In each instance, the normalized MSE has been normalized by the MSE associated with a unary-weighted 8-bit DAC.

The results in FIGS. 14 and 15 were obtained using simulations. The optimized 8-bit DAC architectures used the optimized basis vectors $B_{OPT}$ as provided in Table 3 for basis lengths L=9, 10, 11, 12, 13, and 14. For each optimized basis vector $B_{OPT}$, the optimized representations $W_{OPT}$ were determined using three different algorithms: a Viterbi algorithm (VITERBI—diamonds), a greedy best next algorithm (GBN—closed circles), and a single representation algorithm (1 REP—open circles). The MSE and SNDR associated with the various optimized architectures were compared to the MSE and SNDR associated with three different segmented architectures, as described previously with respect to FIGS. 8 and 9.

As is apparent from FIGS. 14 and 15, an optimized architecture (i.e., having the basis vector $B_{OPT}$ as provided in Table 3, for example) may achieve a lower MSE due to timing offsets and a higher SNDR than a segmented architecture having the same number of switchable current sources, regardless of which technique is used to determine the optimized representations $W_{OPT}$ for the optimized architecture (i.e., Viterbi, GBN, 1 REP). For example, the performance of the 12-switch segmented DAC is exceeded by that of the 12-switch optimized DAC architecture.

It is also apparent from FIGS. 14 and 15 that an optimized architecture may achieve a similar or better performance than a segmented architecture having more switchable current sources. For example, the performance of the 13-switch optimized architecture (when the optimized representations $W_{OPT}$ have been determined using the Viterbi algorithm) exceeds the performance of the 19-switch segmented DAC. Even when the optimized representations $W_{OPT}$ have been determined using less complicated algorithms, the performance of the 19-switch segmented DAC may still be either matched or exceeded by an optimized DAC architecture that comprises fewer switchable current sources.

The optimized representations $W_{OPT}$ were determined based on modeling of statistical error metrics. However, it is also contemplated that the optimized representations $W_{OPT}$ may be determined using real measurements of timing skew in a given DAC.

In general, the simulation results plotted in FIGS. 8, 9, 11, 12, 14, and 15 demonstrate that an optimized DAC architecture may achieve similar (or even better) performance than a segmented DAC architecture having more switchable current sources. Expressed differently, an optimized DAC architecture may achieve better performance than a segmented DAC architecture having the same number of switchable current sources.

In the preceding examples, optimized DAC architectures were determined by minimizing statistical error metrics for glitch errors caused by rise/fall asymmetry or timing skew and current amplitude mismatch errors. It is contemplated that optimized DAC architectures may also be designed based on minimization of additional or alternative error metrics. For example, a statistical error metric may be derived that represents a combination of multiple sources of errors, such as the combined contributions of rise/fall asymmetry and timing skew to glitch errors, and the DAC architecture may be optimized to simultaneously limit both glitch error contributions. In another example, rather than optimizing DAC architectures based on modeling of statistical error metrics, the optimization may be performed on a per-chip or per-device basis using real measurements of errors such as rise/fall asymmetry, current amplitude mismatch, and timing skew.

While the optimized weights may include some unary weights and/or some binary weights, the optimized weights do not (exclusively) consist of unary weights or binary weights. Nor do the optimized weights (exclusively) consist of a combination of unary weights and binary weights (i.e., a hybrid or segmented architecture). In general, it may be shown that a weight ratio of at least one pair of the weighted current sources in an optimized architecture is a positive real number different from an integer power of two. That is, the pair of weights of at least one pair of weighted current sources has a ratio that differs from $2^K$, where K is any whole number (i.e., including zero). It will be apparent that this characteristic necessarily excludes unary-weighting (as illustrated in FIG. 1), binary weighting (as illustrated in FIG. 2), and combined unary/binary weighting (as illustrated in FIG. 3). In contrast, each optimized basis vector $B_{OPT}$ provided in Tables 1, 2, and 3 exhibits this characteristic.

Figure 16:
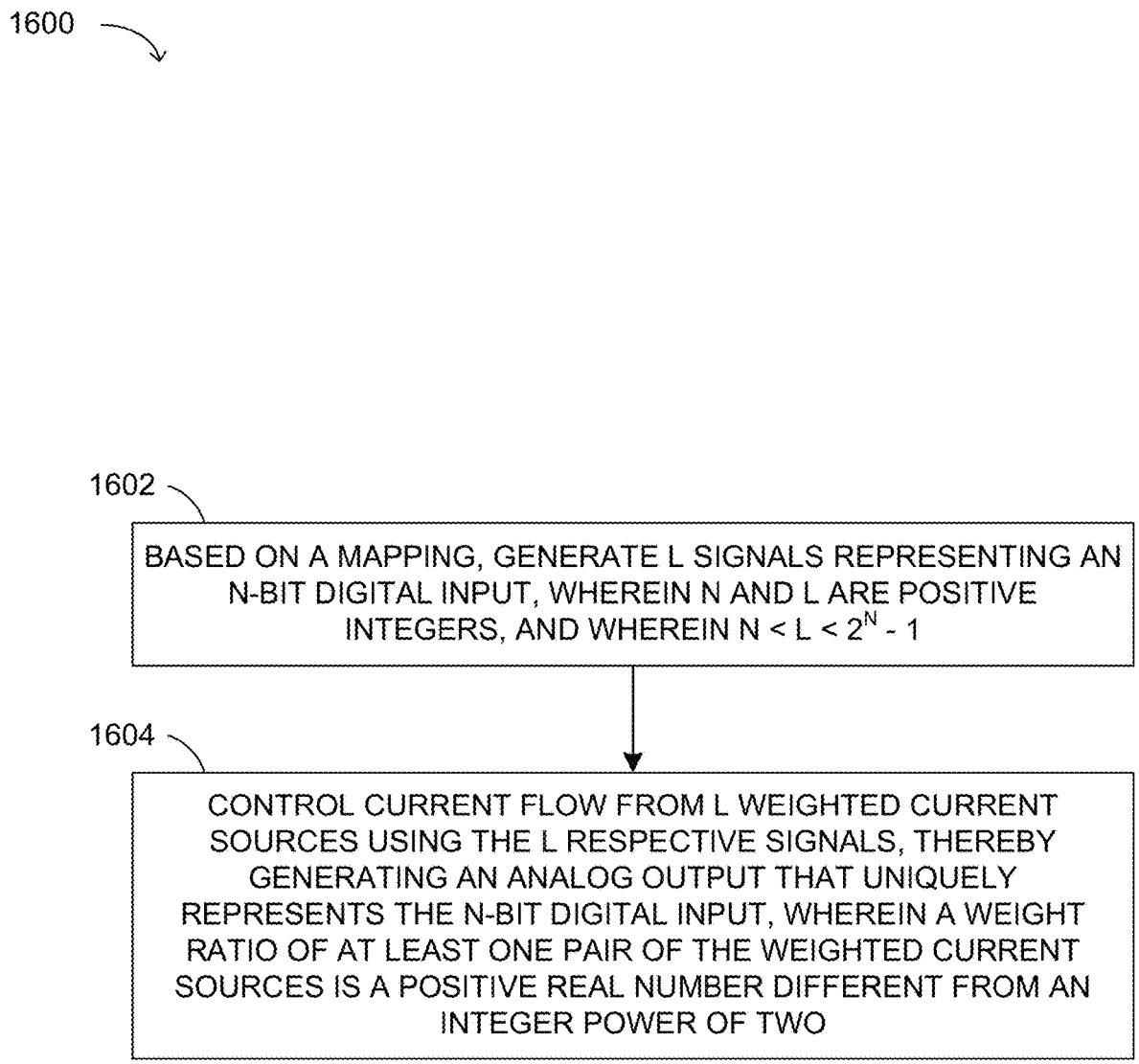
FIG. 16 illustrates a method for digital-to-analog conversion in accordance with some examples of the proposed technology.

FIG. 16 illustrates an example method 1600 for digital-to-analog conversion. The method 1600 may be performed by circuitry of an electronic apparatus, such as the optical transmitter 100. For example, aspects of the method 1600 may be implemented within any of the DACs 130, 131, 138, 139.

At 1602, L signals representing an N-bit digital input are generated based on a mapping, where N and L are positive integers, and where $N<L<2^N-1$. For example, the L signals may be generated by circuitry comprising an N-to-L decoder which maps or converts the N-bit digital input to an L-bit representation of the digital input, where the L signals are the L bits output by the N-to-L decoder. For example, the 8-to-9 decoder 610 generates L=9 signals 608 based on the 8-bit digital input 204. In another example, the 8-to-12 decoder 710 generates L=12 signals 708 based on the 8-bit digital input 204. According to some examples, the mapping is programmable, such that the manner in which the L output bits represent the N input bits may be selected or modified through programming. The mapping may be stored in circuitry of the DAC.

At 1604, current flow from L weighted current sources is controlled using the L respective signals generated at 1602, thereby generating an analog output that uniquely represents the N-bit digital input, wherein a weight ratio of a least one pair of the weighted current sources is a positive real number different from an integer power of two. According to some examples, the weighted current sources have weights configured to minimize at least one error metric associated with the analog output. For example, the nine signals 608 control current flow from the nine respective weighted current sources 602 to generate the analog output 606 that uniquely represents the 8-bit digital input 204. In this particular example (illustrated in FIG. 6), the nine weighted current sources have respective weights [1, 2, 4, 8, 16, 31, 43, 69, 81] configured to minimize the MSE caused by rise/fall asymmetry between currents flowing from the weighted current sources. In another example, the weights may be configured to minimize errors caused by amplitude mismatches between currents flowing from the weighted current sources. For example, where the 8-bit DAC architecture of basis length L=9 is optimized to minimize the MSE caused by current amplitude mismatches, the current weights (basis vector $B_{OPT}$) may be set as [1, 2, 4, 8, 16, 32, 35, 77, 80], as provided in Table 2. In yet another example, the weights may be configured to minimize glitch errors caused by timing offsets of OFF-to-ON and ON-to-OFF transitions between currents flowing from the weighted current sources. For example, where the 8-bit DAC architecture of basis length L=9 is optimized to minimize the MSE caused by timing offsets, the current weights (basis vector $B_{OPT}$) may be set as [1, 2, 4, 8, 16, 31, 43, 69, 81], as provided in Table 3.

According to some examples, the mapping is configured to minimize the error metric associated with the analog output.

As noted above, the optimized DAC is configured such that the number of switchable current sources L satisfies $N<L<2^N-1$. In other words, the optimized DAC has more switches/current sources than a binary-weighted DAC (for which L=N) and has fewer switches/current sources than a unary-weighted (thermometer-coded) DAC (for which $L=2^N-1$). Various segmented DACs may also satisfy $N<L<2^N-1$. However, as has been demonstrated herein, segmented DACs do not employ current weights that are configured to minimize errors associated with the analog output. Accordingly, segmented DACs are not able to achieve the advantages of the proposed optimized DAC architectures, in terms of superior performance and/or reduced footprint.

The technology described thus far may provide for efficient DAC architectures based on the minimization of at least one error metric associated with the analog output of the DAC. According to some examples, the need for low-distortion, low-complexity DACs may alternatively or additionally be addressed by digital pre-compensation of DAC distortion, which will now be described in detail.

DAC distortions, such as those caused by rise/fall asymmetry, current amplitude mismatches, and timing offsets may be pre-compensated for by digital signal processing performed within the DSP.

Figure 17:
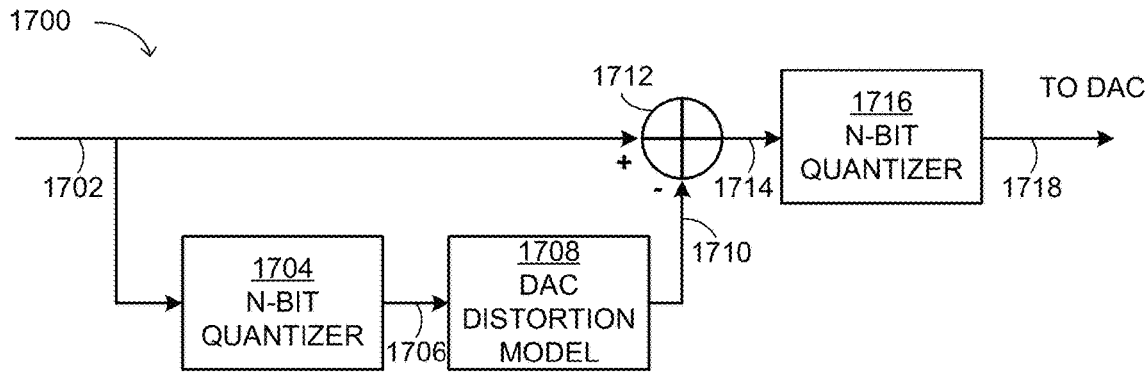
FIG. 17 illustrates a schematic showing digital pre-compensation of DAC distortion in accordance with some examples of the proposed technology.

FIG. 17 illustrates a schematic 1700 showing digital pre-compensation of DAC distortion in accordance with some examples of the proposed technology. Within a DSP, such as the DSP 126 in FIG. 1, processing of digital signals is typically performed at a higher resolution than the resolution of the DACs. For example, the DSP 126 may process digital signals at a 12-bit resolution, followed by 8-bit quantization such that the DACs 130, 131, 138, 139 ultimately receive 8-bit digital input signals. Distortion pre-compensation may be implemented with more accuracy at a higher resolution. Consequently, the pre-compensation illustrated in the example schematic 1700 is applied to a digital signal 1702 having a resolution that is greater than N bits. A distortion model 1708 may be used to generate a predicted error signal 1710 from the digital signal 1702. As will be described in more detail with respect to FIGS. 19, 21, 23, and 25, the distortion model 1708 is characterized by parameters configured to model circuit component mismatches in the DAC, including one or more of rise/fall asymmetry, current amplitude mismatches, and timing offsets. According to some examples, the DAC distortion model 1708 may be implemented with the same N-bit resolution as the DAC. Thus, an N-bit quantizer 1704 may be applied to the digital signal 1702, thereby resulting in an N-bit digital signal 1706 being provided to the DAC distortion model 1708. According to some examples, the predicted error signal 1710 generated by the DAC distortion model 1708 may be subtracted from the digital signal 1702 using a difference operation 1712, thereby resulting in a signal 1714. Where the signal 1714 has a resolution greater than N, an N-bit quantizer 1716 may be applied to the signal 1714, thereby generating an N-bit pre-compensated digital signal 1718 that is based on the predicted error signal 1710. It is this N-bit pre-compensated signal 1718 that is provided to the DAC for conversion to an analog signal. For example, where N=8, the pre-compensated digital signal 1718 may be used as the 8-bit digital input 204 described with respect to any one of FIGS. 2, 3, 4, 6, and 7.

Figure 18:
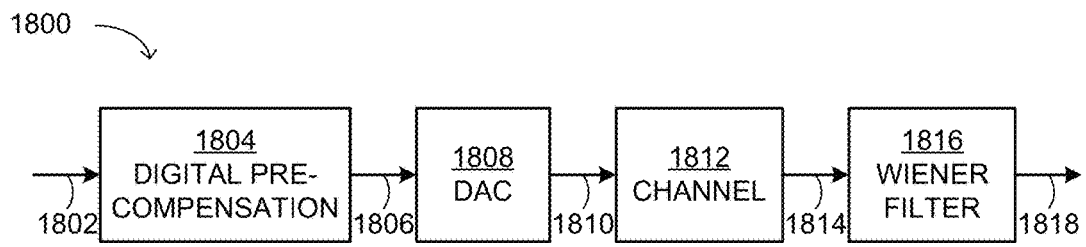
FIG. 18 illustrates a schematic showing aspect of a signal path between a transmitter device and a receiver device in accordance with some examples of the proposed technology.

FIG. 18 illustrates a schematic 1800 showing aspects of a signal path between a transmitter device and a receiver device in accordance with some examples of the proposed technology. At the transmitter device, a pre-compensation process 1804 may be performed on a digital signal 1802, thereby generating a pre-compensated digital signal 1806 that is provided to a DAC 1808. The pre-compensation process 1804 may involve the application of the DAC distortion model 1708 and the difference operation 1712. For example, the pre-compensated digital signal 1806 may correspond to the signal 1718. Using the pre-compensated digital signal 1806, the DAC 1808 generates an analog signal 1810 that is conveyed by the transmitter device over a communication channel 1812 to the receiver device. For example, referring to the optical transmitter 100, the analog drive signals 132, 133, 140, 141 may be conveyed (via the optical signal 122, transmitted over an optical communication channel) to an optical receiver device. At the receiver device, a Wiener filter 1816 or some other adaptive filter may be applied to a signal 1814 received over the channel 1812, thereby resulting in a filtered signal 1818. The pre-compensation process 1804 may be configured to reduce or compensate for predicted errors in the filtered signal 1818 as a result of circuit component mismatches in the DAC 1808.

The performance achieved by the pre-compensation process 1804 may depend on the design of the DAC distortion model 1708, including the parameters used to characterize the distortion model, and the values selected for those parameters. The parameters may be configured to model circuit component mismatches in the DAC comprising one or more of rise/fall asymmetry, current amplitude mismatches, and timing offsets. The following description provides examples of various distortion models designed to model these three types of circuit component mismatches, separately, and in combination.

Pre-Compensation of Rise/Fall Asymmetry

In the absence of the digital pre-compensation process 1804, the predicted error in the filtered signal 1818 at a given time index m as a result of rise/fall asymmetry in the DAC 1808 may be expressed as $$e_{R1}[m] \approx (|c^T[m]| * g_{01}[m])B \qquad [19]$$

wherein $$c[m] = W(x[m]) - W(x[m-1]) \qquad [20]$$

wherein $$g_{01}[m] = \tau_{ON/OFF} * f_C[m] \qquad [21]$$

and wherein $$f_C[m] = f_W[m] * f_{CH}[m] * f_{DAC}[m] \qquad [22]$$

where x[m] denotes the digital signal 1802 at time index m, where W(x[m]) denotes a binary vector of size L which is a function of x[m], where B denotes a basis vector of size L, where $\tau_{ON/OFF}$ denotes the static time offset between the OFF-to-ON transient and the ON-to-OFF transient of the switchable current sources of the DAC 1808, where $f_W[m]$ denotes the impulse response of the receiver's Wiener filter 1816, where $f_{CH}[m]$ denotes the linear impulse response of the channel 1812, where $f_{DAC}[m]$ denotes the linear impulse response of the DAC 1808, and where $f_C[m]$ denotes a combined linear impulse response. Since $W_i(x[m])$, $W_i(x[m-1]) \in \{0, 1\}$, it follows that $c_i[m] \in \{0, +1, -1\}$, for i=1 ... L.

The digital pre-compensation process 1804 may apply a pre-compensation integer term p[m] to the digital signal 1802, where the term p[m] is selected to minimize the error variance of the filtered signal 1818 as a result of rise/fall asymmetry. While it possible to calculate p[m] using the Viterbi algorithm, an approximation may be used to simplify the calculation of p[m]. Specifically, it may be assumed that the pre-compensation term at each time index is small relative to the digital signal 1802 at that time index, such that p[m]<<x[m] and p[m−1]<<x[m−1]. Under this assumption, the problem may be simplified to $$p_{OPT}[m] \approx \underset{p[m]}{\mathrm{argmin}}\left(|e_{R1}[m] + p[m]|^2\right) \qquad [23]$$

such that the optimal pre-compensation term $p_{OPT}[m]$ may be calculated as $$p_{OPT}[M] = \mathrm{round}(-e_{R1}[m]) \qquad [24]$$

where "round" denotes rounding to the nearest integer.

Figure 19:
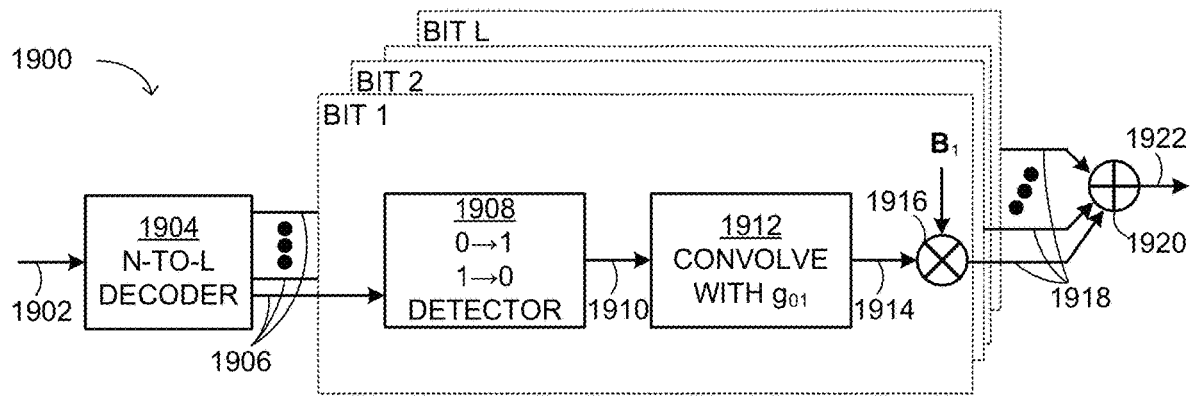
FIG. 19 illustrates a schematic showing a first distortion model representing rise/fall asymmetry in a DAC in accordance with some examples of the proposed technology.

FIG. 19 illustrates a schematic showing a first distortion model 1900 representing rise/fall asymmetry in a DAC in accordance with some examples of the proposed technology.

The first distortion model 1900 is an example of the model 1708. Thus, the signal 1902 is an example of the N-bit digital signal 1706. In the event that the first distortion model 1900 represents distortions in a non-binary DAC (such as a unary DAC or an optimized DAC), an N-to-L decoder 1904 may be applied to the N-bit digital signal 1902, thereby generating L bits 1906 used to control the L weighted current sources of the DAC.

Each one of the L bits 1906 is processed separately. The LSB, denoted as "Bit 1", is considered as an example. At any given point in time, the Bit-1 signal 1906 has a value of either zero or one. In order to model rise/fall asymmetry in the DAC, a detector 1908 is configured to detect transitions between zero and one, over time, in the Bit-1 signal 1906. In other words, the detector 1908 is configured to detect two different two-bit sequences within the Bit-1 signal 1906: bit sequence (0, 1) and bit sequence (1, 0). For two sequential bits in the Bit-1 signal 1906 at time indices m and m−1, the detector 1908 is configured to output a value of "1" if those bits are the sequence (0, 1) or (1, 0), and to output a value of "0" of those bits are the sequence (0, 0) or (1, 1). Thus, the detector 1908 generates, over time, a binary signal 1910 which represents transitions (0-to-1 and 1-to-0) in the Bit-1 signal 1906. Because rise/fall asymmetry errors are only relevant for transitions between different values in the Bit-1 signal 1906, there is no need for the model 1900 to detect the sequences (0, 0) and (1, 1).

The signal 1910 may be convolved with filter coefficients $g_{01}$ of a G-tap finite impulse response (FIR) filter, as shown at 1912, thereby resulting in a signal 1914, where G is a positive integer. A multiplication operation 1916 is used to multiply the signal 1914 by the basis vector $B_1$ for the Bit-1 signal 1906, thereby resulting in a signal 1918. A total of L signals 1918 are generated, one for each of the L bits 1906, where the basis vector $B_i$ is used for the Bit-i signal, for i=1 ... L, and where the filter coefficients $g_{01}$ of the same G-tap filter are used for each of the L bits 1906. A summation operation 1920 is applied to the L signals 1918, thereby resulting in a signal 1922 that represents a sum of the L signals 1918. According to some examples, the summation operation 1920 may also add a bias term (not shown) to correct for tones in the DAC output. This bias term will be described in more detail with respect to FIG. 25.

By appropriate selection of the filter coefficients $g_{01}$ (i.e., the function $g_{01}$ in Equation 21), the distortion model 1900 may be configured such that the signal 1922 represents the error $e_{R1}[m]$ due to rise/fall asymmetry. The signal 1922 is an example of the predicted error signal 1710 generated by the DAC distortion model 1708. As described with respect to FIG. 17, digital pre-compensation is achieved by subtracting the predicted error signal 1710 from the digital signal 1702 (or, equivalently, by adding the pre-compensation term $p_{OPT}[m]$ as expressed in Equation 24).

In order to learn the filter coefficients $g_{01}$, thereby training the model 1900 such that it may be used for an arbitrary digital input signal, a reference digital signal may be used. The reference signal may be selected such that all the current cells of the DAC 1808 are exercised, and such that an adequate number of 0-to-1 transitions and 1-to-0 transitions are observed, for example, 100 of each type. In response to inputting the reference signal to the DAC 1808, an error $e_W[m]$ may be measured at the output of the Wiener filter 1816. Given the measured error $e_W[m]$, it is possible to estimate the filter coefficients $g_{01}$ using the relationship in Equation 19 (with $e_W[m]$ in place of $e_{R1}[m]$).

While the detector 1908 is configured to detect the two-bit sequences (0, 1) and (1,0), alternative examples are contemplated wherein bit sequences comprising more than two bits are detected using one or more detectors. Such examples will be described further with respect to FIG. 25.

The detector 1908 is configured to detect both 0-to-1 and 1-to-0 transitions, thereby resulting in a single binary signal 1910 that is convolved with a single set of filter coefficients $g_{01}$. However, other examples are contemplated wherein separate detectors are configured to detect 0-to-1 and 1-to-0 transitions, respectively, thereby resulting in separate, parallel binary signals that are convolved with separate filter coefficients $g_{01}$ and $g_{10}$, respectively. This alternative design would enable modeling of different settling transients for an OFF-to-ON transition and an ON-to-OFF transition in a given switchable current source.

Figure 20:
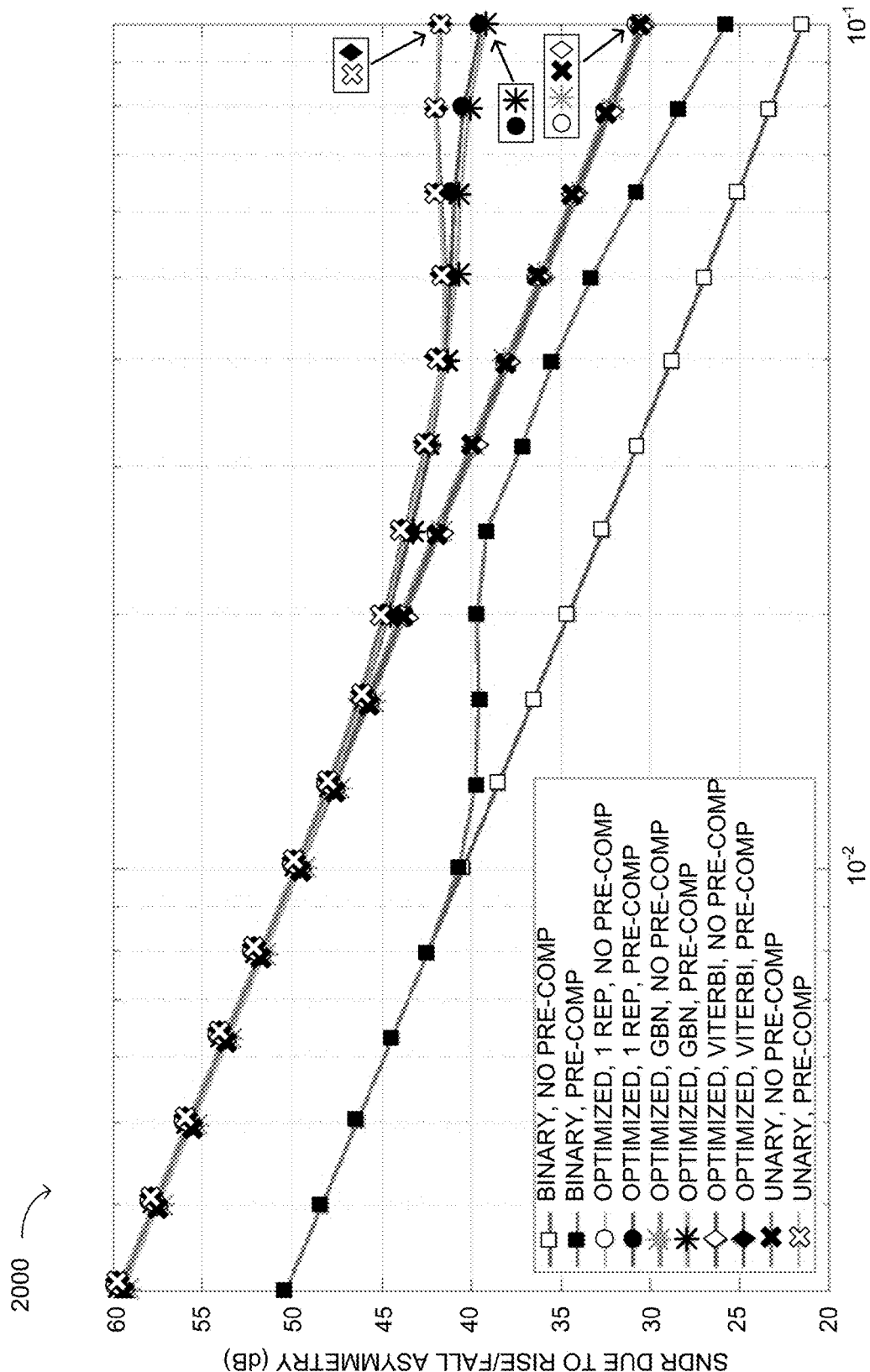
FIG. 20 illustrates a plot of SNDR due to rise/fall asymmetry as a function of rise/fall asymmetry for several DAC architectures with and without pre-compensation in accordance with some examples of the proposed technology.

FIG. 20 illustrates a plot 2000 of SNDR due to rise/fall asymmetry as a function of the standard deviation of the rise/fall asymmetry normalized by the sampling period T for several DAC architectures with and without pre-compensation in accordance with some examples of the proposed technology.

The results in FIG. 20 were obtained using simulations. The optimized DAC architecture used the optimized basis vector $B_{OPT}$ as provided in Table 1 for basis length L=13, and the optimized representations $W_{OPT}$ were determined using a Viterbi algorithm, a greedy best next algorithm, and a single representation algorithm.

As is apparent from FIG. 20, for each DAC architecture, digital pre-compensation of distortion due to rise/fall asymmetry may achieve an improvement in SNDR. This performance enhancement is achieved when the rise/fall asymmetry error exceeds the resolution of the DAC. As expected, when the error amplitude is smaller than the resolution of the DAC, no performance enhancement is observed. A higher-resolution DAC may benefit more from digital pre-compensation than a lower-resolution DAC. The best performance is achieved by using digital pre-compensation with either the 8-bit unary-weighted DAC or the 8-bit optimized DAC exploiting the Viterbi algorithm.

Pre-Compensation of Current Amplitude Mismatches

In another example, the pre-compensation process 1804 may be configured to reduce or compensate for predicted errors in the filtered signal 1818 as a result of current amplitude mismatches. In the absence of the digital pre-compensation 1804, the error in the filtered signal 1818 at a given time index m as a result of current amplitude mismatches in the DAC 1808 may be expressed as $$e_{R2}[m] \approx f_C[m] * \sum_{i=1}^{L} W_i(x[m])\Delta_i \qquad [25]$$

where $\Delta$ denotes the current amplitude mismatch errors of the L switchable current sources.

Figure 21:
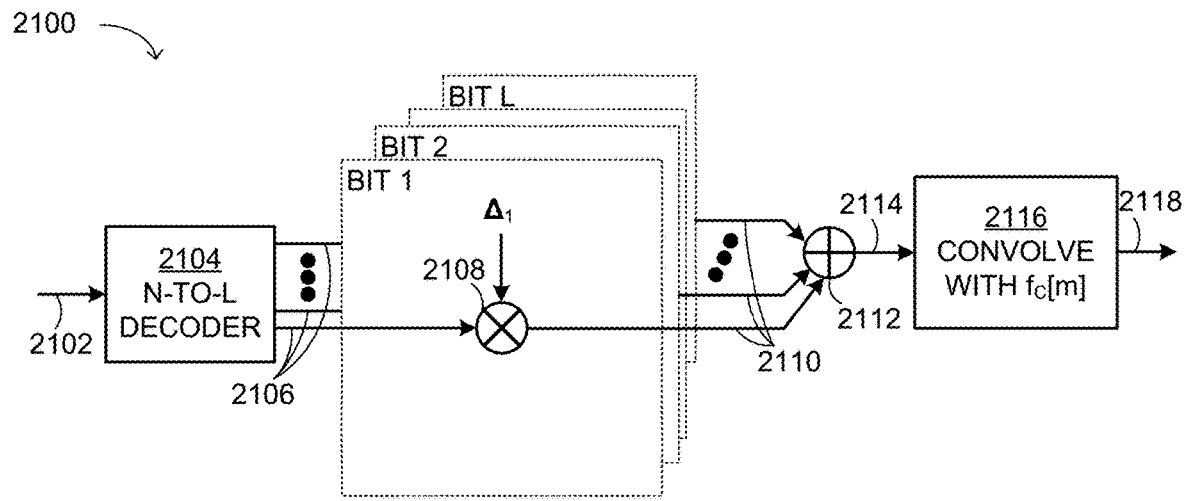
FIG. 21 illustrates a schematic showing a second distortion model representing current amplitude mismatches in a DAC in accordance with some examples of the proposed technology.

FIG. 21 illustrates a schematic 2100 showing a second distortion model representing current amplitude mismatches in a DAC in accordance with some examples of the proposed technology.

The second distortion model 2100 is an example of the model 1708. Thus, the signal 2102 is an example of the N-bit digital signal 1706. In the event that the second distortion model 2100 represents distortions in a non-binary DAC (such as a unary DAC or an optimized DAC), an N-to-L decoder 2104 may be applied to the N-bit digital signal 2102, thereby generating L bits 2106 used to control the L weighted current sources of the DAC.

Each one of the L bits 2106 is processed separately. The LSB, Bit 1, is considered as an example. In order to model current amplitude mismatches in the DAC, a multiplication operation 2108 is used to multiply the Bit-1 signal 2106 by the current amplitude mismatch error $\Delta_1$ for the Bit-1 signal 2106, thereby resulting in a signal 2110 which represents the current error for the switchable current source handling Bit 1. A total of L signals 2110 are generated, one for each of the L bits 2106, where the current error $\Delta_i$ is used for the Bit-i signal, for i=1 . . . L. A summation operation 2112 is applied to the L signals 2110, thereby resulting in a signal 2114 that represents a sum of the L signals 2110. According to some examples, the summation operation 2112 may also add a bias term (not shown) to correct for tones in the DAC output. This bias term will be described in more detail with respect to FIG. 25. The signal 2114 may be convolved with the combined impulse response $f_C[m]$, as shown at 2116, thereby resulting in a signal 2118.

By appropriate selection of the current amplitude mismatch errors $\Delta$, the model 2100 may be configured such that the signal 2118 represents the error $e_{R2}[m]$ due to current amplitude mismatches. The signal 2118 is an example of the predicted error signal 1710 generated by the DAC distortion model 1708.

As described with respect to the model 1900, the model 2100 may be trained using a reference signal. In this case, with knowledge of the combined linear impulse response $f_C[m]$, the values of current amplitude mismatch errors $\Delta$ may be estimated using a least-squares minimization expressed as:

$$\underset{\Delta}{\text{minimize}} \sum_{m=0}^{M-1} \left| f_C[m] * \sum_{i=1}^{L} W_i(x[m])\Delta_i - e_W[m] \right|^2 \qquad [26]$$

where $e_W[m]$ denotes the measured error after the Wiener filter 1816 for the reference signal input to the DAC 1808, and where M denotes the length of the reference signal.

For an arbitrary input digital signal 1802, denoted x, the digital pre-compensation process 1804 may apply a pre-compensation integer term p(x) to the digital signal 1802, where the term p(x) is selected to minimize the error variance of the filtered signal 1818 as a result of current amplitude mismatches. The optimal pre-compensation term $p_{OPT}(x)$ may be calculated as $$p_{OPT}(x) = \qquad [27]$$
$$\underset{p(x)}{\text{argmin}}\left(\left|p(x) - \mathbb{E}[p(x)] + W^T(x + p(x))\Delta - \mathbb{E}\left[W^T(x + p(x))\Delta\right]\right|^2\right)$$

where $-x \leq p(x) \leq 2^N - 1 - x$. The DC effect of the pre-compensation terms may be neglected with minimal performance impact, such that the optimal pre-compensation term may be approximated by the expression $$P_{OPT}(x) = \underset{p(x)}{\text{argmin}}\left(\left|p(x) + W^T(x + p(x))\Delta\right|^2\right). \qquad [28]$$

Thus, given the current amplitude mismatch errors Δ estimated using Equation 25, the optimal pre-compensation terms $p_{OPT}(x)$ may be calculated independently for each value of x.

As described with respect to FIG. 17, digital pre-compensation is achieved by subtracting the predicted error signal 1710 from the digital signal 1702 (or, equivalently, by adding the pre-compensation term $p_{OPT}(x)$). The pre-compensation terms $p_{OPT}(x)$ may be stored in a LUT of size $2^N$.

Figure 22:
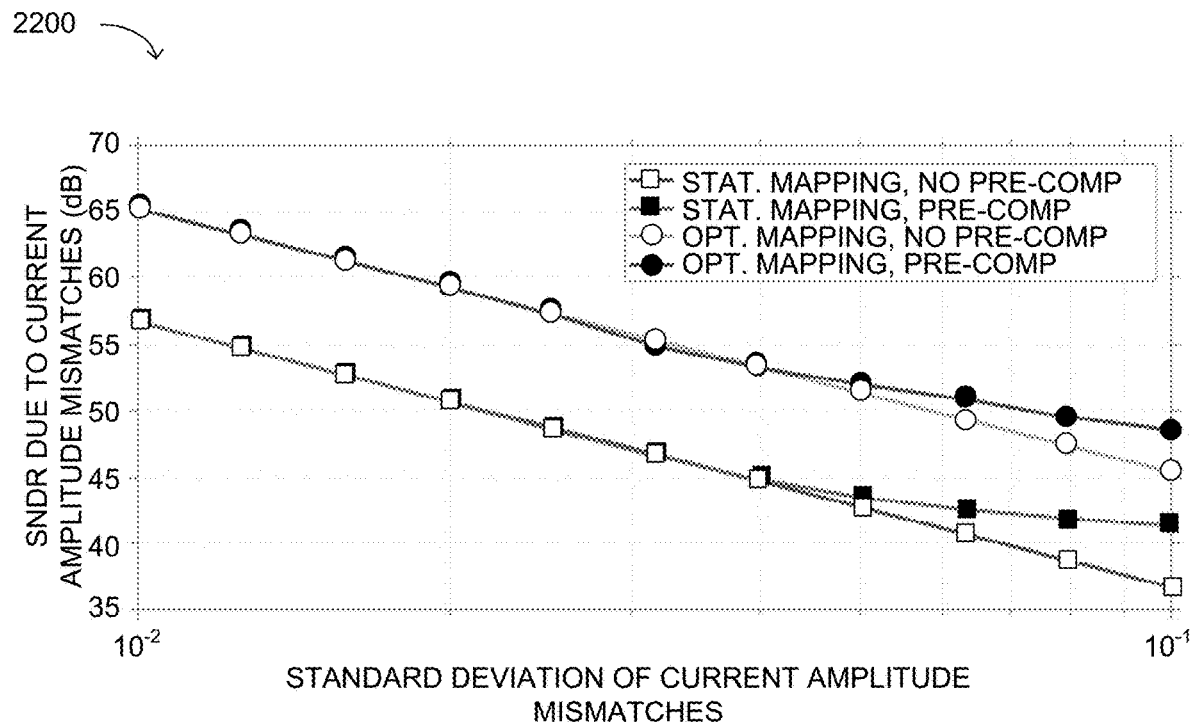
FIG. 22 illustrates a plot of SNDR due to current amplitude mismatches as a function of the standard deviation of the current amplitude mismatches for several optimized DAC architectures with and without pre-compensation in accordance with some examples of the proposed technology.

FIG. 22 illustrates a plot 2200 of SNDR due to current amplitude mismatches as a function of the standard deviation of the current amplitude mismatches for several optimized DAC architectures with and without pre-compensation in accordance with some examples of the proposed technology.

The results in FIG. 22 were obtained using simulations (statistical selection) and DAC-specific measurements (optimal mapping). The optimized DAC architecture used the optimized basis vector $B_{OPT}$ as provided in Table 2 for basis length L=12.

As is apparent from FIG. 22, digital pre-compensation of distortion due to current amplitude mismatches may achieve an improvement in SNDR. This performance enhancement is achieved when the current amplitude mismatch standard deviation exceeds half an LSB. The improvement achieved by the digital pre-compensation may be increased if the pre-compensation term is applied to a higher-resolution version of the digital input signal, prior to N-bit quantization.

Pre-Compensation of Timing Offsets

In yet another example, the pre-compensation process 1804 may be configured to reduce or compensate for predicted errors in the filtered signal 1818 as a result of timing offsets. In the absence of the digital pre-compensation 1804, the predicted error in the filtered signal 1818 at a given time index m as a result of timing offsets in the DAC 1808 may be expressed as $$e_{R3}[m] = \sum_{i=1}^{L} ((c_i[m] * g_{i,01}[m])B_i) \quad [29]$$

wherein $$g_{i,01}[m] = \tau_i[m] * f_C[m] \quad [30]$$

where $\tau_i$ denotes the timing offset associated with the $i^{th}$ switch, where i=1 ... L, and $f_C[m]$ denotes the combined linear impulse response expressed in Equation 22.

Figure 23:
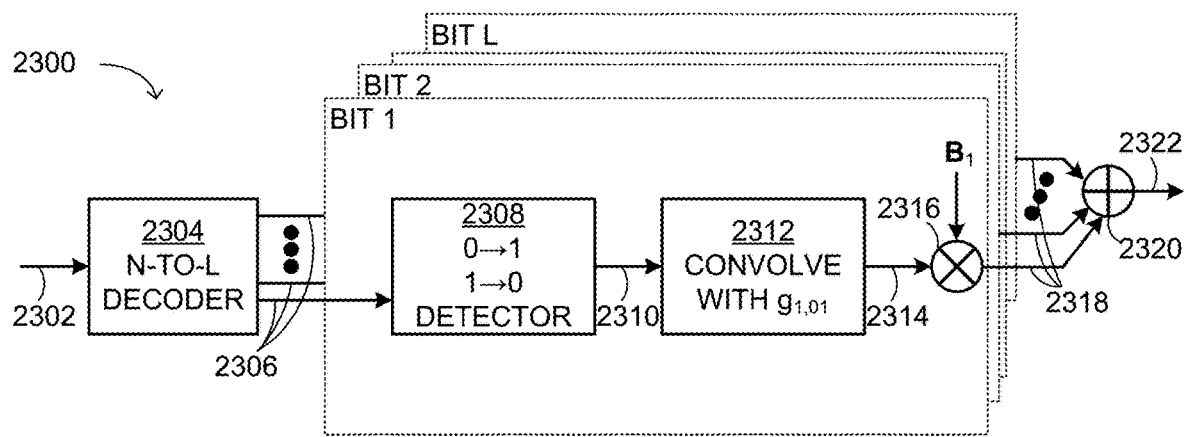
FIG. 23 illustrates a schematic showing a third distortion model representing timing offsets in a DAC in accordance with some examples of the proposed technology.

FIG. 23 illustrates a schematic 2300 showing a third distortion model representing timing offsets in a DAC in accordance with some examples of the proposed technology.

The third distortion model 2300 is an example of the model 1708. Thus, the signal 2302 is an example of the N-bit digital signal 1706. In the event that the third distortion model 2300 represents distortions in a non-binary DAC (such as a unary DAC or an optimized DAC), an N-to-L decoder 2304 may be applied to the N-bit digital signal 2302, thereby generating L bits 2306 used to control the L weighted current sources of the DAC.

Each one of the L bits 2306 is processed separately. The LSB, Bit 1, is considered as an example. At any given point in time, the Bit-1 signal 2306 has a value of either zero or one. In order to model timing offsets in the DAC, a detector 2308 is configured to detect transitions between zero and one, over time, in the Bit-1 signal 2306. Thus, similarly to the detector 1908, the detector 2308 generates, over time, a binary signal 2310 which represents transitions (0-to-1 and 1-to-0) in the Bit-1 signal 2306. Because rise/fall asymmetry errors are only relevant for transitions between different values in the Bit-1 signal 2306, there is no need for the model 2300 to detect the sequences (0, 0) and (1, 1).

The signal 2306 may be convolved with filter coefficients $g_{i,01}$ of a G-tap FIR filter, as shown at 2312, thereby resulting in a signal 2314, where G is a positive integer. A multiplication operation 2316 is used to multiply the signal 2314 by the basis vector $B_1$ for the Bit-1 signal 2306, thereby resulting in a signal 2318. A total of L signals 2318 are generated, one for each of the L bits 2306, where filter coefficients $g_{i,01}$ of a distinct G-tap filter are used for the Bit-i signal, and where the basis vector $B_i$ is used for the Bit-i signal, for i=1 ... L. A summation operation 2320 is applied to the L signals 2318, thereby resulting in a signal 2322 that represents a sum of the L signals 2318. According to some examples, the summation operation 2320 may also add a bias term (not shown) to correct for tones in the DAC output. This bias term will be described in more detail with respect to FIG. 25.

By appropriate selection of the filter coefficients $g_{i,01}$, the model 2300 may be configured such that the signal 2322 represents the error $e_{R3}[m]$ due to timing offsets. Thus, as expressed in Equation 30, the filter coefficients $g_{i,01}$ may be understood as corresponding to the product of $f_C[m]$ and $\tau_i$. The signal 2322 is an example of the predicted error signal 1710 generated by the DAC distortion model 1708.

As described previously with respect to the models 1900 and 2100, the model 2300 may be trained using a reference signal. In this case, the filter coefficients $g_{i,01}[m]$ may be estimated using a least-squares minimization expressed as:

$$\underset{g_{1,01},\ldots,g_{L,01}}{\text{minimize}} \sum_{m=1}^{M-1} \left| \sum_{i=1}^{L} ((c_i[m] * g_{i,01}[m])B_i) - e_W[m] \right|^2 \quad [31]$$

where $e_W[m]$ denotes the measured error after the Wiener filter 1816 for the reference signal input to the DAC 1808, and where M denotes the length of the reference signal.

The estimates of the functions $g_{i,01}[m]$ for i=1 ... L may then be used to obtain estimates of $e_{R3}[m]$ using Equation 29. As previously described with respect to Equations 23 and 24, the optimal pre-compensation term $p_{OPT}[m]$ may be approximated as the negated predicted error $e_{R3}[m]$.

While the detector 2308 is configured to detect the two-bit sequences (0, 1) and (1,0), alternative examples are contemplated wherein bit sequences comprising more than two bits are detected using one or more detectors. Such examples will be described further with respect to FIG. 25.

The detector 2308 is configured to detect both 0-to-1 and 1-to-0 transitions in the Bit-1 signal 2306, thereby resulting in a single binary signal 2310 that is convolved with a single set of filter coefficients $g_{1,01}$. However, other examples are contemplated wherein separate detectors are configured to detect 0-to-1 and 1-to-0 transitions, respectively, thereby resulting in separate, parallel binary signals that are convolved with separate filter coefficients $g_{1,01}$ and $g_{1,10}$, respectively. This alternative design would enable modeling of different settling transients for an OFF-to-ON transition and an ON-to-OFF transition in a given switchable current source.

Figure 24:
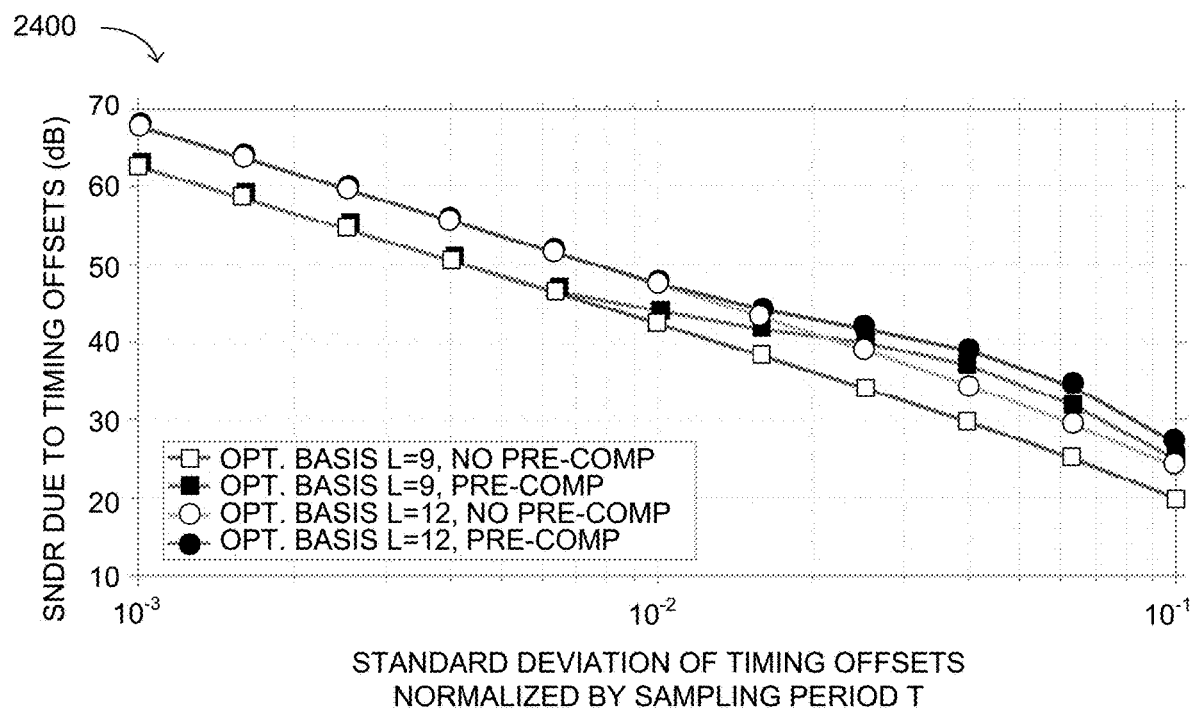
FIG. 24 illustrates a plot of SNDR due to timing offsets as a function of the standard deviation of the timing offsets with and without pre-compensation in accordance with some examples of the proposed technology.

FIG. 24 illustrates a plot 2400 of SNDR due to timing offsets as a function of the standard deviation of the timing offsets normalized by the sampling period T for several optimized DAC architectures with and without pre-compensation in accordance with some examples of the proposed technology.

The results in FIG. 24 were obtained using simulations. The optimized DAC architectures used the optimized basis vectors $B_{OPT}$ as provided in Table 3 for basis lengths L=9 and L=12, and the optimized representations $W_{OPT}$ were determined using a single representation algorithm.

As is apparent from FIG. 24, digital pre-compensation of distortion due to timing offsets may achieve an improvement in SNDR. This performance enhancement is achieved when the timing offset standard deviation exceeds the resolution of the DAC.

Pre-Compensation of Rise/Fall Asymmetry, Current Amplitude Mismatches, and Timing Offsets The DAC distortion models 1900, 2100, and 2300 separately model rise/fall asymmetry, current amplitude mismatches, and timing offsets, respectively. It is also possible to design a model that represents a combination of DAC distortions.

In the absence of the digital pre-compensation process 1804, the error in the filtered signal 1818 at a given time index m as a result of rise/fall asymmetry, current amplitude mismatches, and timing offsets in the DAC 1808 may be expressed as $$e_R[m] = \sum_{i=1}^{L} (c_{i,01}[m] * g_{i,01}[m] + c_{i,10}[m] * g_{i,10}[m] + c_{i,11}[m] * g_{i,11}[m]) B_i \quad [32]$$

wherein $$c_{i,kl}[m] = \begin{cases} 1, & \text{if } W_i(x[m-1]) = k \text{ AND } W_i(x[m]) = l \\ 0, & \text{otherwise.} \end{cases} \quad [33]$$

The functions $g_{i,01}[m]$ and $g_{i,10}[m]$ represent rise/fall asymmetry and timing offsets, which are only in effect when there is a 0-to-1 transition or a 1-to-0 transition. The function $g_{i,11}[m]$ represents current amplitude mismatches, which are only in effect when there is a 1-to-1 transition.

The predicted error $e_R[m]$ in Equation 32 only considers bit sequences of length J=2. However, for a higher speed DAC with limited bandwidth, it may be advantageous to bit sequences comprising more than two bits. For example, where the model considers bit sequences of length J=3, the error in the filtered signal 1818 may be expressed as $$e_R[m] = \sum_{i=1}^{L} \left( \sum_{j=0}^{1} \sum_{k=0}^{1} \sum_{\substack{l=0 \\ l \neq j=k=0}}^{1} c_{i,jkl}[m] * g_{i,jkl}[m] \right) B_i \quad [34]$$

wherein $$c_{i,jkl}[m] = \quad [35]$$
$$\begin{cases} 1, & \text{if } W_i(x[m-1]) = j \text{ AND } W_i(x[m]) = k \text{ AND } W_i(x[m+1]) = l \\ 0, & \text{otherwise.} \end{cases}$$

The functions $g_{i,000}[m]$ and $g_{i,111}[m]$ represent current amplitude mismatches, which are only in effect when the bit sequence is (0, 0, 0) or (1, 1, 1), while the remaining six functions represent rise/fall asymmetry and timing offsets, which are only in effect when the bit sequence is (0, 0, 1), (1, 1, 0), (0, 1, 0), (1, 0, 1), (0, 1, 1), or (1, 0, 0).

The DAC output may comprise dominant tones at fs/2 and fs/4, where fs denotes the sampling frequency. In order to correct for these tones, a bias term may be added to each modulo-4 phase of the result in Equation 34, such that the predicted error is expressed as $$e_R[m] = \sum_{i=1}^{L} \left( \sum_{j=0}^{1} \sum_{k=0}^{1} \sum_{\substack{l=0 \\ l \neq j=k=0}}^{1} c_{i,jkl}[m] * g_{i,jkl}[m] \right) B_i + b_{m \bmod 4} \quad [36]$$

Figure 25:
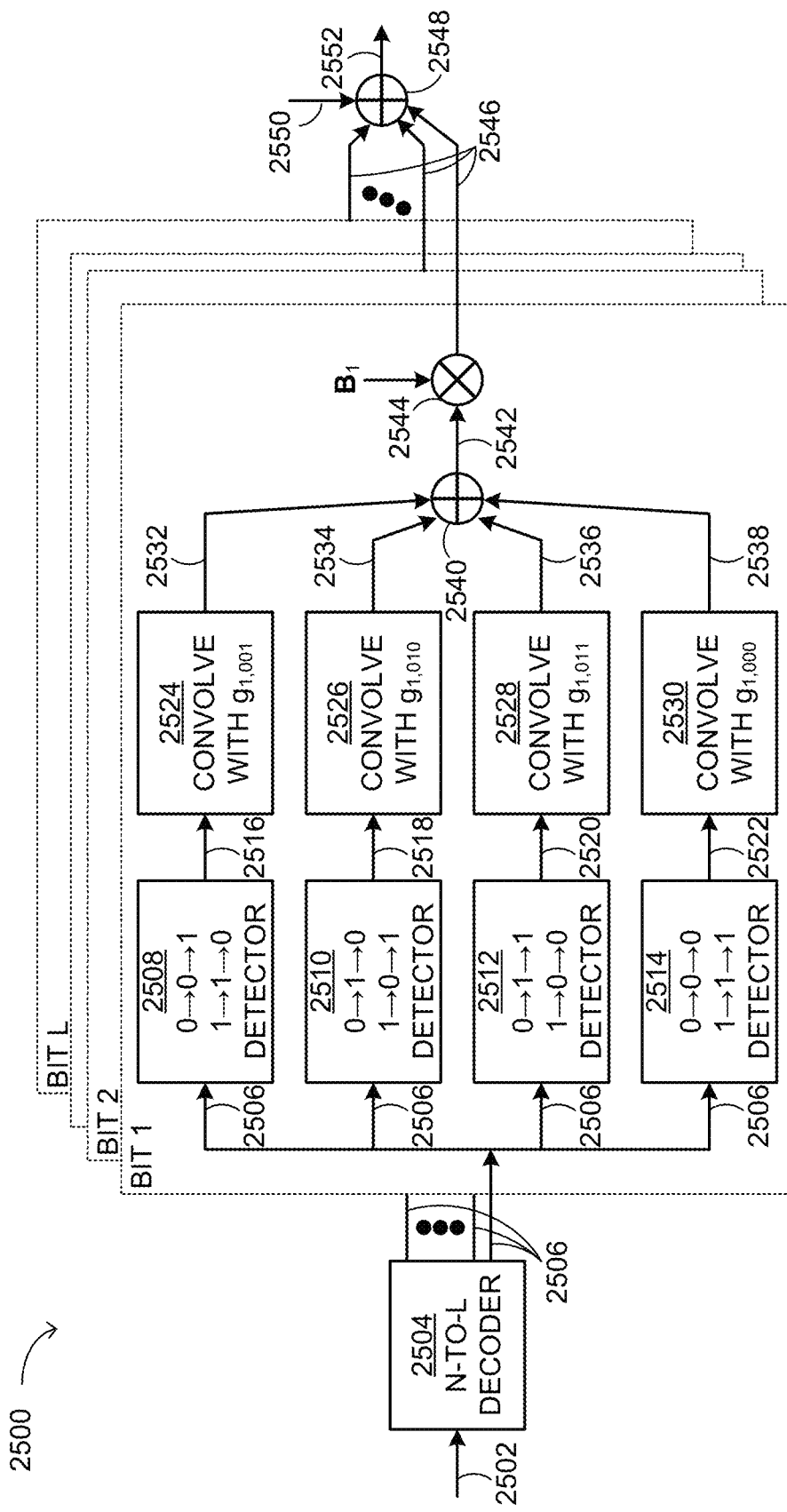
FIG. 25 illustrates a schematic showing a fourth distortion model representing rise/fall asymmetry, current amplitude mismatches, and timing offsets in a DAC in accordance with some examples of the proposed technology.

FIG. 25 illustrates a schematic 2500 showing a fourth distortion model representing rise/fall asymmetry, current amplitude mismatches, and timing offsets in a DAC in accordance with some examples of the proposed technology.

The fourth distortion model 2500 is an example of the model 1708. Thus, the signal 2502 is an example of the N-bit digital signal 1706. In the event that the fourth distortion model 2500 represents distortions in a non-binary DAC (such as a unary DAC or an optimized DAC), an N-to-L decoder 2504 may be applied to the N-bit digital signal 2502, thereby generating L bits 2506 used to control the L weighted current sources of the DAC.

Each one of the L bits 2506 is processed separately. The LSB, Bit 1, is considered as an example. At any given point in time, the Bit-1 signal 2506 has a value of either zero or one. As previously described with respect to the models 1900 and 2300, rise/fall asymmetry and timing offsets may be modeled using a detector configured to detect transitions between zero and one, over time, in the Bit-1 signal (i.e., two-bit sequences (0, 1) and (1, 0)). However, more accurate modeling of the DAC distortions may be achieved by using detectors configured to detect sequences of more than two bits. For example, the model 2500 uses four detectors 2508, 2510, 2512, and 2514 to detect three-bit sequences in the Bit-1 signal 2506. Specifically, the detector 2508 is configured to generate a binary signal 2516 representing the presence of the three-bit sequences (0, 0, 1) and (1, 1, 0); the detector 2510 is configured to generate a binary signal 2518 representing the presence of the three-bit sequences (0, 1, 0) and (1, 0, 1); the detector 2512 is configured to generate a binary signal 2520 representing the presence of the three-bit sequences (0, 1, 1) and (1, 0, 0); and the detector 2514 is configured to generate a binary signal 2522 representing the presence of the three-bit sequences (0, 0, 0) and (1, 1, 1).

The signals 2516, 2518, 2520, and 2522 may be convolved with respective filter coefficients $g_{1,001}$, $g_{1,010}$, $g_{1,011}$, and $g_{1,000}$ of four G-tap FIR filters, as shown at 2524, 2526, 2528, and 2530, respectively, where G is a positive integer, thereby resulting in respective signals 2532, 2534, 2536, and 2538. A summation operation 2540 may be applied to the signals 2532, 2534, 2536, and 2538, thereby resulting in a signal 2542. A multiplication operation 2544 is used to multiply the signal 2542 by the basis vector $B_i$ for the Bit-1 signal 2506, thereby resulting in a signal 2546. A total of L signals 2546 are generated, one for each of the L bits 2506, where the filter coefficients $g_{i,001}$, $g_{i,010}$, $g_{i,011}$, and $g_{i,000}$ of a distinct set of G-tap filters are used for the Bit-i signal, and where the basis vector $B_i$ is used for the Bit-i signal, for i=1 ... L. A summation operation 2548 is applied to the L signals 2546 and to a bias term 2550, thereby resulting in a signal 2552 that represents a sum of the L signals 2546 and the bias term 2550.

By appropriate selection of the filter coefficients $g_{i,001}$, $g_{i,010}$, $g_{i,011}$, and $g_{i,000}$, the model 2500 may be configured such that the signal 2552 represents the error $e_R[m]$ due to on/off asymmetry, current amplitude mismatches, and timing offsets. The signal 2552 is an example of the predicted error signal 1710 generated by the DAC distortion model 1708.

The model 2500 may be trained using a reference signal. As described previously, the reference signal may be selected such that all the current cells of the DAC are exercised, and such that an adequate number of each type of three-bit sequence is observed, for example, 100 of each type. In the case of the model 2500, the filter coefficients $g_{i,001}[m]$, $g_{i,010}[m]$, $g_{i,011}[m]$, and $g_{i,000}[m]$, and the bias term $b_{m \bmod 4}$ may be estimated using the l2-norm (or Euclidean norm) minimization expressed as:

$$\underset{g,b}{\text{minimize}} \sum_{m=1}^{M-1} \left| \sum_{i=1}^{L} \left( \sum_{j=0}^{1} \sum_{k=0}^{1} \sum_{\substack{l=0 \\ l \neq j=k=0}}^{1} c_{i,jkl}[m] * g_{i,jkl}[m] \right) B_i + b_{m \bmod 4} - e_W[m] \right|^2 \quad [37]$$

where $e_W[m]$ denotes the measured error after the Wiener filter 1816 for the reference signal input to the DAC 1808, and where M denotes the length of the reference signal.

The estimates of the functions $g_{i,001}[m]$, $g_{i,010}[m]$, $g_{i,011}[m]$, and $g_{i,000}[m]$ for i=1 ... L and the estimate of the bias term $b_{m \bmod 4}$ may then be used to obtain estimates of $e_R[m]$ using Equation 36. As previously described, the optimal pre-compensation term $p_{OPT}[m]$ may be approximated as the negated predicted error $e_R[m]$.

While the detectors 2508, 2510, 2512, and 2514 are configured to detect three-bit sequences, alternative examples are contemplated wherein bit sequences comprising more than three bits (or fewer, i.e., two bits) are detected using a plurality of detectors.

Each of the detectors 2508, 2510, 2512, and 2514 is configured to detect two different three-bit sequences. For example, the detector 2508 is configured to detect both the sequence (0, 0, 1) and the sequence (1, 1, 0) in the Bit-1 signal 2306, thereby resulting in a single binary signal 2516 that is convolved with a single set of filter coefficients $g_{1,001}$. However, other examples are contemplated wherein separate detectors are configured to detect the sequence (0, 0, 1) and the sequence (1, 1, 0), respectively, thereby resulting in separate, parallel binary signals that are convolved with separate filter coefficients $g_{1,001}$ and $g_{1,100}$, respectively. This alternative design would enable modeling of different settling transients for an OFF-to-ON transition and an ON-to-OFF transition in a given switchable current source.

Figure 26:
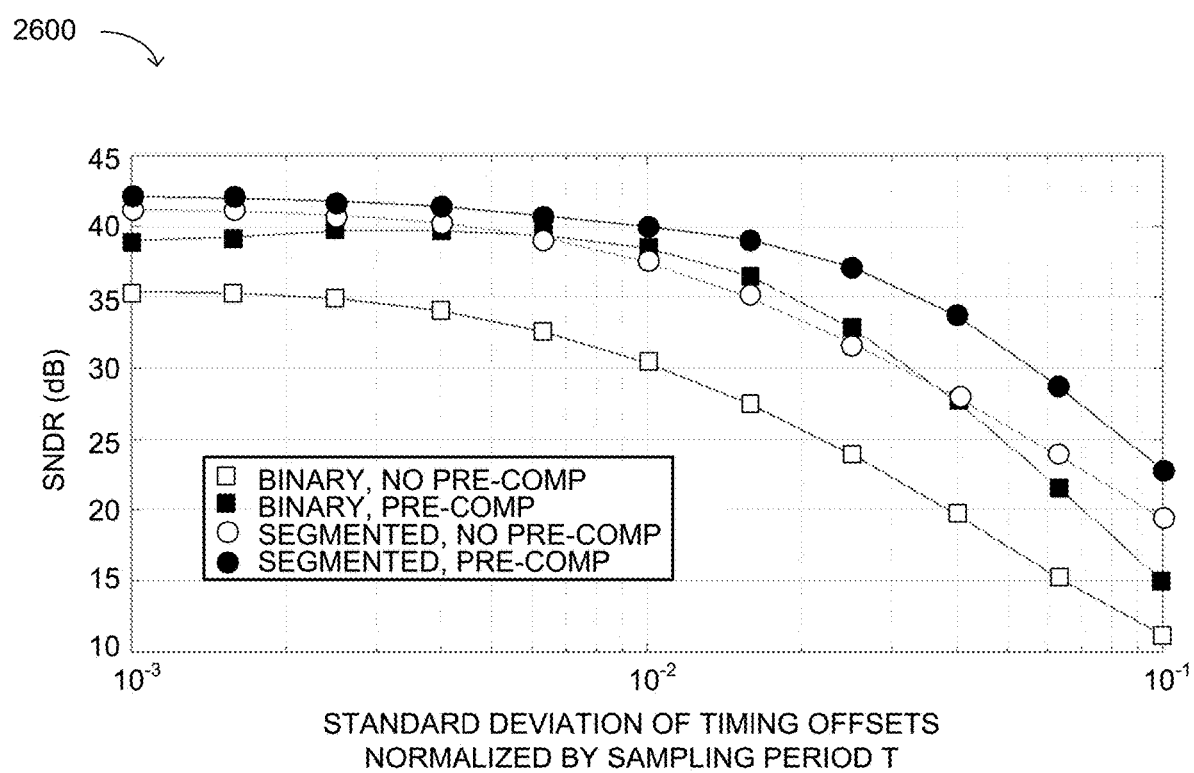
FIG. 26 illustrates a plot of SNDR due to rise/fall asymmetry, current amplitude mismatches, and timing offsets as a function of the standard deviation of the timing offsets with and without pre-compensation in accordance with some examples of the proposed technology.

FIG. 26 illustrates a plot 2600 of SNDR due to rise/fall asymmetry, current amplitude mismatches, and timing offsets as a function of the standard deviation of the timing offsets normalized by the sampling period T for several DAC architectures with and without pre-compensation in accordance with some examples of the proposed technology.

The results in FIG. 26 were obtained using simulations with $\tau_{ON/OFF}/T=0.01$ and $\sigma_\delta=0.05$. The binary results were obtained using the 8-bit binary DAC architecture 300, while the segmented results were obtained using the 8-bit segmented DAC architecture 400.

As is apparent from FIG. 26, digital pre-compensation using the model 2500 may achieve an improvement in SNDR.

Figure 27:
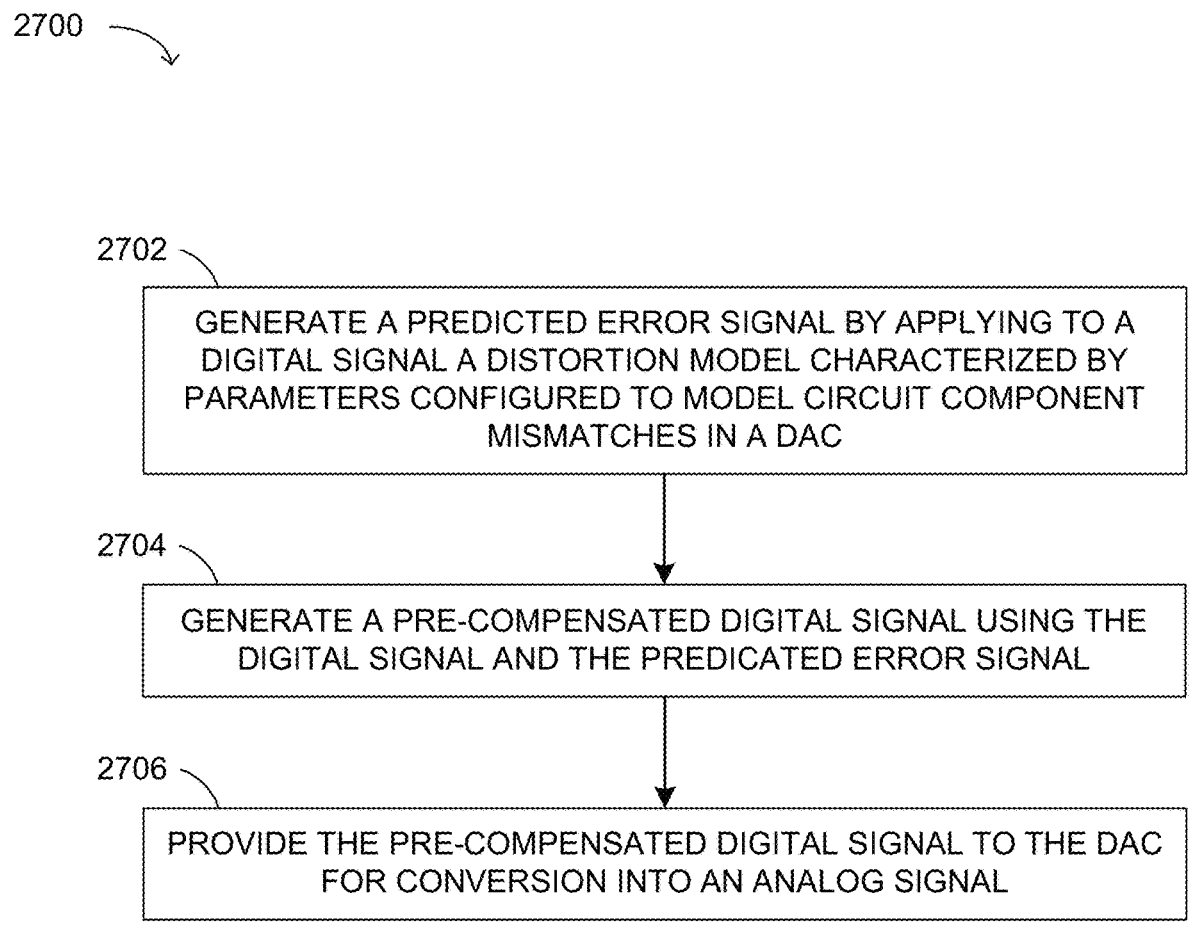
FIG. 27 illustrates a method for digital pre-compensation of distortion in a DAC in accordance with some examples of the proposed technology.

FIG. 27 illustrates an example method 2700 for digital pre-compensation of distortion in a DAC in accordance with some examples of the proposed technology. The method 2700 may be performed by circuitry of an electronic apparatus, such as the optical transmitter 100. For example, aspects of the method 2700 may be implemented within the DSP 126.

At 2702, a predicted error signal is generated by applying a distortion model to a digital signal, where the distortion model is characterized by parameters configured to model circuit component mismatches in a DAC. For example, the predicted error signal 1922 is generated by applying the distortion model 1900 to the digital signal 1902; the predicted error signal 2118 is generated by applying the distortion model 2100 to the digital signal 2102; the predicted error signal 2322 is generated by applying the distortion model 2300 to the digital signal 2302; and the predicted error signal 2552 is generated by applying the distortion model 2500 to the digital signal 2502. The parameters may comprise, for example, coefficients of the plurality of FIR filters. For example, the filter coefficients $g_{01}$ (FIG. 19), $g_{i,01}$ (FIG. 23), and $g_{i,001}$, $g_{i,010}$, $g_{i,011}$, $g_{i,000}$ (FIG. 25) are examples of parameters configured to model circuit component mismatches in a DAC. The current amplitude mismatches A (FIG. 21) are also examples of such parameters.

There are various types of DAC component mismatches from which signal-dependent errors/distortions may originate. For example, where the DAC comprises a plurality of weighted current sources, the circuit component mismatches may comprise one or more of rise/fall asymmetry between currents flowing from the weighted current sources; amplitude mismatches between currents flowing from the weighted current sources; and timing offsets of OFF-to-ON and ON-to-OFF transitions between currents flowing from the weighted current sources.

According to some examples, the distortion model comprises a plurality of detectors, where each detector is configured to detect sequences of J bits in the digital signal, wherein J 2, and wherein each bit is selected from 0 and 1. Examples of the detectors include the detectors 1908 and 2308, which are configured to detect two-bit sequences, and the detectors 2508, 2510, 2512, and 2514 which are configured to detect three-bit sequences.

According to some examples, the distortion model is further characterized by a bias term configured to correct for predicted tones in the analog signal, such as the bias term 2550.

At 2704, a pre-compensated digital signal is generated using the digital signal and the predicted error signal generated at 2702. According to some examples, the pre-compensated digital signal is generated based on a difference between the digital signal and the predicted error signal. According to some examples, the pre-compensated digital signal comprises N bits per sample and the digital signal comprises more than N bits per sample, where N is a positive integer. According to some examples, the distortion model is applied to the digital signal at a resolution of N bits per sample. For example, as described with respect to FIG. 17, the pre-compensated digital signal 1718 is generated using the digital signal 1702 and the predicted error signal 1710. The pre-compensated digital signal 1718 is generated based on the difference between the digital signal 1702 and the predicted error signal 1710 (using the difference operation 1712). In this example, the N-bit quantizer 1716 ensures that the pre-compensated digital signal 1718 comprises N bits per sample, while the digital signal 1702 comprises more than N bits per sample. The N-bit quantizer 1704 ensures that the distortion model 1708 is applied at a resolution of N bits per sample.

At 2706, the pre-compensated digital signal generated at 2704 is provided to the DAC for conversion into an analog signal.

According to some examples, the method 2700 may be implemented in combination with the method 1600. For example, the pre-compensated digital signal generated at step 2704 in the method 2700 may comprise the same digital signal used at step 1602 in the method 1600. In other words, the DAC to which the pre-compensated digital signal is provided at 2706 may comprise a plurality of weighted current sources, wherein a weight ratio of at least one pair of the weighted current sources is a positive real number different from an integer power of two.

The scope of the claims should not be limited by the details set forth in the examples, but should be given the broadest interpretation consistent with the description as a whole.

What is claimed is:

1. A digital-to-analog converter (DAC) comprising:
   circuitry configured to generate, based on a mapping, L signals representing an N-bit digital input, wherein N and L are positive integers, and wherein $N<L<2^N-1$; and
   circuitry configured to control current flow from L weighted current sources using the L respective signals, thereby generating an analog output that uniquely represents the N-bit digital input, wherein a weight ratio of at least one pair of the weighted current sources is a positive real number different from an integer power of two.

2. The DAC as claimed in claim 1, wherein the weighted current sources have weights configured to minimize at least one error metric associated with the analog output.

3. The DAC as claimed in claim 2, wherein the at least one error metric represents errors caused by statistical rise/fall asymmetry between currents flowing from the weighted current sources.

4. The DAC as claimed in claim 2, wherein the at least one error metric represents errors caused by statistical amplitude mismatches between currents flowing from the weighted current sources.

5. The DAC as claimed in claim 2, wherein the at least one error metric represents errors caused by statistical timing offsets of OFF-to-ON and ON-to-OFF transitions between currents flowing from the weighted current sources.

6. The DAC as claimed in claim 2, wherein the mapping is configured to minimize the at least one error metric.

7. The DAC as claimed in claim 2, wherein the mapping is configured to minimize a DAC-specific error metric representing errors caused by circuit component mismatches measured in the DAC.

8. The DAC as claimed in claim 7, wherein the circuit component mismatches comprise one or more of
   rise/fall asymmetry between currents flowing from the weighted current sources;
   amplitude mismatches between currents flowing from the weighted current sources; and
   timing offsets of OFF-to-ON and ON-to-OFF transitions between currents flowing from the weighted current sources.

9. The DAC as claimed in claim 1, wherein weights of the weighted current sources do not solely consist of a combination of unary weights and binary weights.

10. The DAC as claimed in claim 1, wherein the digital input comprises a pre-compensated digital signal generated based on a distortion model representing circuit component mismatches in the DAC.

11. A method for digital-to-analog conversion comprising:
    generating, based on a mapping, L signals representing an N-bit digital input, wherein N and L are positive integers, and wherein $N<L<2^N-1$; and
    controlling current flow from L weighted current sources of a digital-to-analog converter (DAC) using the L respective signals, thereby generating an analog output that uniquely represents the N-bit digital input, wherein a weight ratio of at least one pair of the weighted current sources is a positive real number different from an integer power of two.

12. The method as claimed in claim 11, wherein the weighted current sources have weights configured to minimize at least one error metric associated with the analog output.

13. The method as claimed in claim 12, wherein the at least one error metric represents glitch errors caused by statistical rise/fall asymmetry between currents flowing from the weighted current sources.

14. The method as claimed in claim 12, wherein the at least one error metric represents errors caused by statistical amplitude mismatches between currents flowing from the weighted current sources.

15. The method as claimed in claim 12, wherein the at least one error metric represents glitch errors caused by statistical timing offsets of OFF-to-ON and ON-to-OFF transitions between currents flowing from the weighted current sources.

16. The method as claimed in claim 12, wherein the mapping is configured to minimize the at least one error metric.

17. The method as claimed in claim 12, further comprising calculating the mapping by minimizing a DAC-specific error metric representing errors caused by circuit component mismatches measured in the DAC.

18. The method as claimed in claim 17, wherein the circuit component mismatches comprise one or more of
    rise/fall asymmetry between currents flowing from the weighted current sources;
    amplitude mismatches between currents flowing from the weighted current sources; and
    timing offsets of OFF-to-ON and ON-to-OFF transitions between currents flowing from the weighted current sources.

19. The method as claimed in claim 11, wherein weights of the weighted current sources do not solely consist of a combination of unary weights and binary weights.

20. The method as claimed in claim 11, wherein the digital input comprises a pre-compensated digital signal generated based on a distortion model representing circuit component mismatches in the DAC.

* * * * *